(12) United States Patent
Suzuki et al.

(10) Patent No.: US 10,394,749 B2
(45) Date of Patent: Aug. 27, 2019

(54) ASYNCHRONOUS TRANSCEIVER FOR ON-VEHICLE ELECTRONIC DEVICE

(71) Applicant: Cypress Semiconductor Corporation, San Jose, CA (US)

(72) Inventors: Akihiro Suzuki, Aichi (JP); Masami Nakashima, Aichi (JP); Masuo Inui, Aichi (JP); Koji Okada, Yokohama (JP); Takeo Zaitsu, Kawasaki (JP); Takashi Shimizu, Kasugai (JP); Shinichi Yamamoto, Kasugai (JP); Kazuhiro Tomita, Kasugai (JP); Susumu Kuroda, Aichi (JP)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 15/941,549

(22) Filed: Mar. 30, 2018

(65) Prior Publication Data
US 2018/0276179 A1    Sep. 27, 2018

Related U.S. Application Data

(63) Continuation of application No. 15/374,529, filed on Dec. 9, 2016, now Pat. No. 9,971,731, which is a
(Continued)

(51) Int. Cl.
*G06F 1/04*  (2006.01)
*G06F 1/08*  (2006.01)
(Continued)

(52) U.S. Cl.
CPC .......... *G06F 13/4291* (2013.01); *G06F 1/04* (2013.01); *G06F 1/08* (2013.01); *G06F 1/10* (2013.01);
(Continued)

(58) Field of Classification Search
CPC ..... G06F 1/04; G06F 1/08; G06F 1/10; G06F 1/12; G06F 1/3237; G06F 1/3287;
(Continued)

(56) References Cited

U.S. PATENT DOCUMENTS 5,132,990 A    7/1992  Dukes
5,602,878 A    2/1997  Cross
(Continued)

FOREIGN PATENT DOCUMENTS

CN    102857255 A    1/2013
DE    602004012966    5/2009
(Continued)

OTHER PUBLICATIONS

U.S. Appl. No. 14/865,676: "Asynchronous Transceiver for On-Vehicle Electronic Device" Akihiro Suzuki et al., filed Sep. 25, 2015; 75 pages.
(Continued)

*Primary Examiner* — Glenn A. Auve

(57) ABSTRACT

An on-vehicle system comprises a Clock Extension Peripheral Interface (CXPI) bus and a device coupled to the CXPI bus. The device comprises a transceiver configured to: detect a baud rate clock signal and a phase difference between the baud rate clock signal and an input data signal that was generated asynchronously from the baud rate clock signal; obtain a timing from an edge of the baud rate clock signal based the phase difference; capture a value of the input data signal at the timing; and transmit the captured value as an output data signal over the CXPI bus.

20 Claims, 38 Drawing Sheets

Related U.S. Application Data continuation of application No. 14/865,676, filed on Sep. 25, 2015, now Pat. No. 9,541,990.

(60) Provisional application No. 62/191,164, filed on Jul. 10, 2015, provisional application No. 62/150,467, filed on Apr. 21, 2015, provisional application No. 62/150,460, filed on Apr. 21, 2015, provisional application No. 62/150,466, filed on Apr. 21, 2015, provisional application No. 62/150,492, filed on Apr. 21, 2015, provisional application No. 62/150,484, filed on Apr. 21, 2015, provisional application No. 62/150,478, filed on Apr. 21, 2015.

(51) Int. Cl.

| | | |
|---|---|---|
| *G06F 1/10* | (2006.01) | |
| *G06F 1/12* | (2006.01) | |
| *G06F 13/40* | (2006.01) | |
| *G06F 13/42* | (2006.01) | |
| *H03K 5/156* | (2006.01) | |
| *G06F 1/3237* | (2019.01) | |
| *G06F 1/3287* | (2019.01) | |
| *G06F 13/364* | (2006.01) | |

(52) U.S. Cl.
CPC .............. *G06F 1/12* (2013.01); *G06F 1/3237* (2013.01); *G06F 1/3287* (2013.01); *G06F 13/364* (2013.01); *G06F 13/4018* (2013.01); *H03K 5/1565* (2013.01)

(58) Field of Classification Search
CPC .............. G06F 13/4291; G06F 13/364; G06F 13/4018; H03K 5/1565
See application file for complete search history.

(56) References Cited

U.S. PATENT DOCUMENTS

| | | | |
|---|---|---|---|
| 6,949,958 | B2 | 9/2005 | Zerbe et al. |
| 7,924,783 | B1 | 4/2011 | Mahany et al. |
| 8,155,256 | B2 | 4/2012 | Staszewski et al. |
| 9,541,990 | B2 * | 1/2017 | Suzuki ................ G06F 13/4291 |
| 9,971,731 | B2 * | 5/2018 | Suzuki ................ G06F 13/4291 |
| 2003/0117191 | A1 | 6/2003 | Kwak |
| 2003/0128111 | A1 | 7/2003 | Sano et al. |
| 2003/0155953 | A1 | 8/2003 | Hirata et al. |
| 2004/0218705 | A1 | 11/2004 | Cranford et al. |
| 2008/0129354 | A1 | 6/2008 | Ma |
| 2008/0297215 | A1 | 12/2008 | Ma |
| 2009/0323728 | A1 | 12/2009 | Koutsoures et al. |
| 2010/0141312 | A1 | 6/2010 | Lee |
| 2011/0051870 | A1 | 3/2011 | Itou |
| 2013/0287155 | A1 | 10/2013 | Nakamizo et al. |
| 2013/0301635 | A1 | 11/2013 | Hollabaugh et al. |
| 2013/0318380 | A1 | 11/2013 | Behrens et al. |
| 2014/0088794 | A1 | 3/2014 | Yashiro et al. |
| 2015/0098296 | A1 | 4/2015 | Na et al. |
| 2015/0333869 | A1 | 11/2015 | Miura |

FOREIGN PATENT DOCUMENTS

| | | |
|---|---|---|
| EP | 1594253 B1 | 4/2008 |
| JP | 2005109955 A | 4/2005 |
| JP | 2011235770 A | 11/2011 |

OTHER PUBLICATIONS

International Search Report for International Application No. PCT/US16/18411 dated May 16, 2016; 2 pages.

Pogliano, Umberto, et al., "Wideband digital phase comparator for high current shunts," date Oct. 4, 2011, 20 pages.

SIPO Office Action for Application No. 201680001900.5 dated Feb. 28, 2018; 5 pages.

SIPO Office Action for Application No. 201680001900.5 dated Sep. 5, 2017; 6 pages.

USPTO Non Final Rejection for U.S. Appl. No. 14/865,676 dated Aug. 1, 2016; 5 pages.

USPTO Non Final Rejection for U.S. Appl. No. 15/374,529 dated Aug. 28, 2017; 6 pages.

USPTO Notice of Allowance for U.S. Appl. No. 14/865,676 dated Aug. 31, 2016; 6 pages.

USPTO Notice of Allowance for U.S. Appl. No. 15/374,529 dated Jan. 3, 2018; 5 pages.

Written Opinion of the International Searching Authority for International Application No. PCT/US16/18411 dated May 16, 2016; 4 pages.

German Exam Report for Application No. 11 2016 001 863.0 dated Jun. 27, 2018; 12 pages.

SIPO Office Action for Application No. 2016800019005 dated Jul. 2, 2018; 3 pages.

JPO Office Action for Application No. 2017-206543 dated Oct. 30, 2018; 5 pages.

Notice Reasons for Refusal for Application No. 2017-206543 dated May 14, 2019; 2 pages.

* cited by examiner

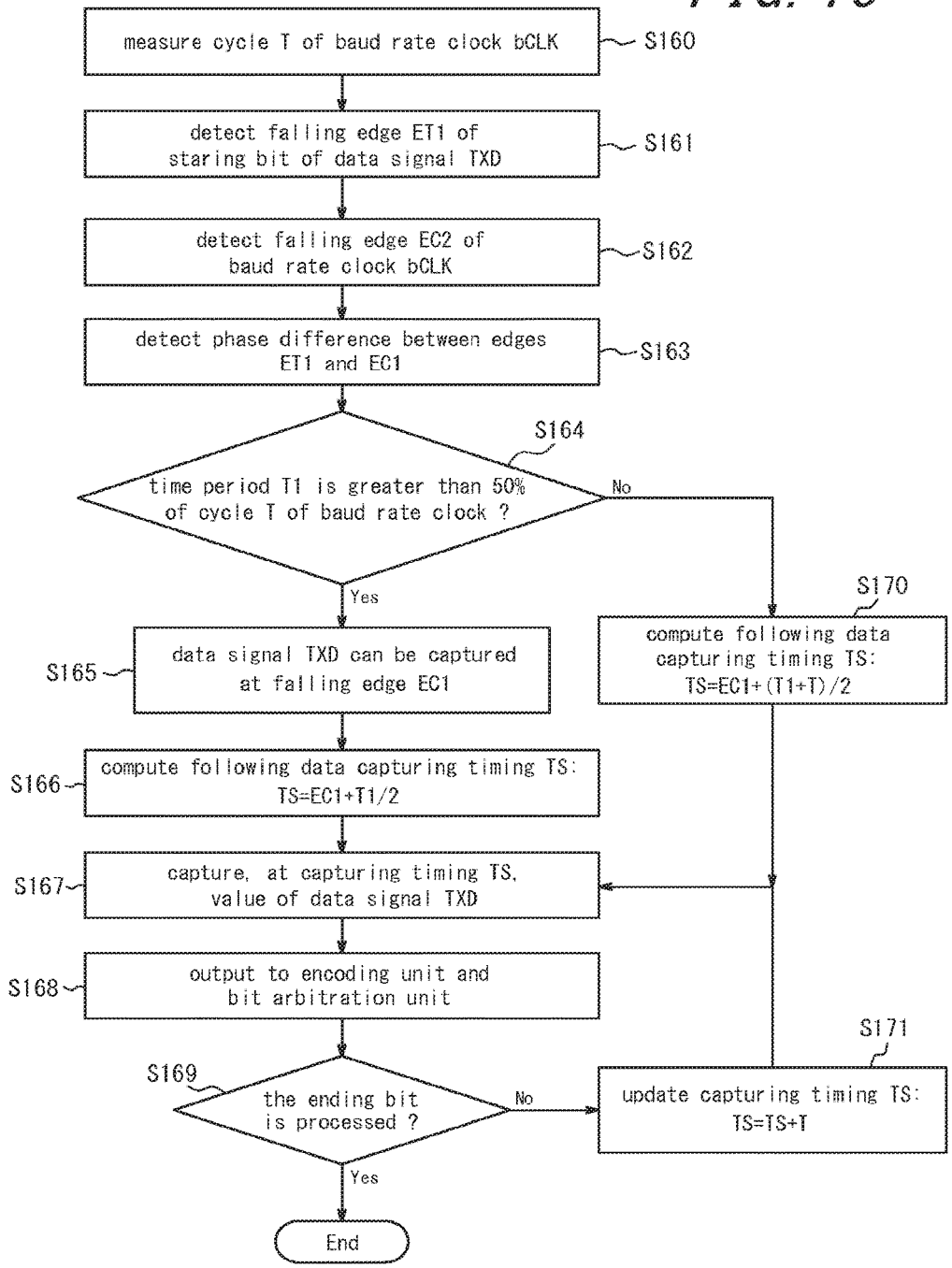

ASYNCHRONOUS TRANSCEIVER FOR ON-VEHICLE ELECTRONIC DEVICE

CROSS REFERENCE TO RELATED APPLICATION

This Application is Continuation of U.S. patent application Ser. No. 15/374,529, filed on Dec. 9, 2016, which is a Continuation of U.S. patent application Ser. No. 14/865,676, filed on Sep. 25, 2015, now U.S. Pat. No. 9,541,990, issued on Jan. 10, 2017, which claims priority to and the benefit of U.S. Provisional Patent Applications No. 62/150,460 (filed on Apr. 21, 2015), No. 62/150,466 (filed on Apr. 21, 2015), No. 62/150,467 (filed on Apr. 21, 2015), No. 62/150,478 (filed on Apr. 21, 2015), No. 62/150,484 (filed on Apr. 21, 2015), No. 62/150,492 (filed on Apr. 21, 2015) and No. 62/191,164 (filed on Jul. 10, 2015), all of which are incorporated herein by reference in their entirety.

TECHNICAL FIELD

Embodiments discussed herein relate to an on-vehicle electronic device and the like.

BACKGROUND

For electronically controlling the operation of various devices on a vehicle, such as an internal combustion engine, an air conditioner, door mirrors, power windows and wipers, various electronic devices are mounted on the vehicle. In recent years, one vehicle is equipped with 50-60 units of such electronic devices, and the number of the on-vehicle electronic devices is increasing. Electronic devices such as controllers, or ECU's (Electronic Control Units) are connected to the bus of an on-vehicle LAN (Local Area Network), and transmit/receive data in accordance with protocols such as LIN (Local Interconnect Network), CAN (Controller Area Network), or CXPI (Clock Extension Peripheral Interface), etc.

Various problems may occur in data transmission/reception between on-vehicle electronic devices.

SUMMARY

Embodiments discussed herein relate to an on-vehicle electronic device and the like for solving various problems which occur with an on-vehicle LAN.

In one embodiment, an on-vehicle electronic device includes:

a generating unit configured to generate a first clock for data communication with another on-vehicle electronic device through a CXPI communication network; and an adjusting unit configured to adjust a duty width of the first clock.

In another embodiment, an on-vehicle electronic device includes:

a generating unit configured to generate a first clock for data communication with another on-vehicle electronic device through a CXPI communication network; and an adjusting unit configured to perform spectrum spreading to the first clock.

In yet another embodiment, an on-vehicle electronic device includes:

a delay unit configured to generate a first clock by delaying an internal clock;

a shaping unit configured to generate a second clock by increasing a slew rate of the internal clock;

a switch configured to output a third clock based on the first and second clocks, the third clock having a rising edge of the first clock and a falling edge of the second clock; and an interface configured to cause the third clock to become a low level when a reference clock used for data communication with another on-vehicle electronic device through a CXPI communication network becomes a low level.

In yet another embodiment, an on-vehicle electronic device includes:

a detecting unit configured to detect a cycle of a clock and a phase difference between the clock and a data signal generated separately from the clock;

a computing unit configured to obtain a data capturing timing shifted from a edge of the clock based on the cycle and the phase difference; and a synchronization unit configured to capture a value of the data signal at the timing of the data capturing timing and generate a data signal to be transmitted to another on-vehicle electronic device through a CXPI communication network.

In yet another embodiment, an on-vehicle electronic device includes:

a transceiver configured to operate in a first mode for receiving a reference clock which is encoded through a CXPI communication network from a master node, for decoding the reference clock, and for outputting the reference clock as a first output clock, or in a second mode for outputting as a second output clock the reference clock without decoding;

a control unit configured to send to the transceiver a signal to cause the transceiver to transit from the first mode to the second mode, and to obtain the first output clock from the transceiver, on receiving the second output clock from the transceiver, by sending to the transceiver a signal to cause the transceiver to transit from the second mode to the first mode.

In yet another embodiment, a circuit includes:

a detecting unit configured to detect a phase difference between a first clock and a second clock having a frequency which is slower than that of the first clock;

a selecting unit configured to select, based on the phase difference and cycles of the first and the second clocks, a first pattern when an edge of the second clock corresponds to the first half of the cycle of the first clock, and a second pattern when the edge of the second clock corresponds to the second half of the cycle of the first clock; and a delay unit configured to delay the second clock without delaying the first clock in the first pattern, the first clock without delaying the second clock in the second pattern, and transmits the first clock to a first circuit, which transmits data in sync with the first clock, and the second clock to a second circuit, which receives the data in sync with the second clock.

In yet another embodiment, an on-vehicle electronic device includes:

an output buffer configured to amplify a signal, which is input, to have an amplitude between a first potential lower than a power supply potential and a second potential above a ground potential, and output the signal to an on-vehicle network; and a shaping unit configured to shape a signal, which is input, to have an amplitude such that the signal has the amplitude between the first and second potentials when output from the output buffer.

BRIEF DESCRIPTION OF THE DRAWINGS

The embodiments will be further described below with reference to the accompanying drawings, wherein:

FIG. 16 is a flowchart illustrating operations of a transceiver;

DESCRIPTION OF EMBODIMENTS

In accordance with the CXPI, a plurality of slave node ECU's are connected to one master node ECU. The master node ECU regularly sends out to a bus a reference clock for data communication. A slave node ECU will transmit data in accordance with the reference clock. Or, each ECU may operate by using an internally generated clock. Hereinafter, when referring to an ECU of each node, the ECU is simply referred to as the "master node" or a "slave node".

First Embodiment

Figure 1:
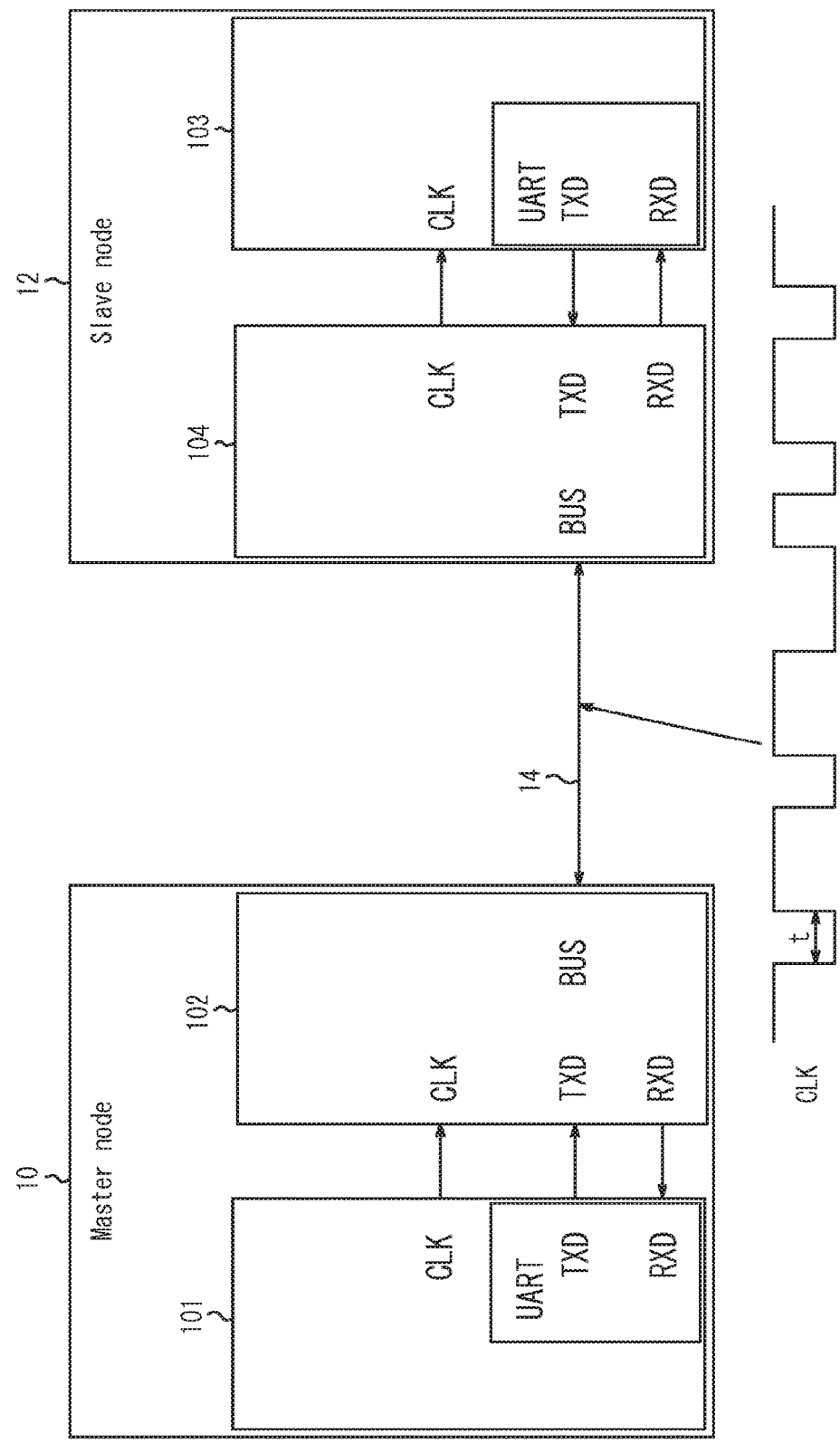
FIG. 1 is a schematic diagram illustrating an example of master and slave nodes in the CXPI communication.

FIG. 1 is a schematic diagram illustrating an example of a master node and a slave node in the CXPI communication. The master node 10 has a transceiver 102 and an MCU (Micro Controller Unit) 101. Also the slave node 12 has a transceiver 104 and an MCU 103. The MCU 101 and 103 respectively transmit to and receive from the transceiver 102 and 104, data (TXD, RXD) via a UART's (Universal Asynchronous Receiver Transmitter). The transceiver 102 of the master node 10 and the transceiver 104 of the slave node 12 perform data transmission/reception via a bus 14. In the CXPI communication, a square-wave signal with a duty ratio of not 50% is used as a reference clock CLK. The transceivers 102 and 104 each may be configured by including a transmission/reception circuit and circuits performing various signal processing, such as DSP (Digital Signal Processor), an ASIC (Application Specific IC) and the like.

In the CXPI communication, a frequency of 19.2 kHz (19.2 kbps) is generally used for the reference clock of the bus. Frequency 19.2 kHz of the reference clock is equivalent to the seventh harmonic of a radio wave of 134 kHz for a so-called smart key system. The smart key system is a system for controlling unlocking/locking and starting vehicle engines by radio communication from wireless terminals. That is, in the CXPI communication, the bus may generate noise that can interfere with a weak radio wave of the smart key system.

To suppress such noise, the duty width of the reference clock may be changed. For the duty width t of the reference clock with duty ratio of not 50%, the power of harmonics having frequencies of n/t (n=1, 2, . . . ) is decreased. For example, by making the duty width of the reference clock 14.9 µs, the level of a harmonic in 134 kHz, obtained by multiplying the reference clock CLK by seven times, may be decreased.

However, in this case, 2% error in controlling the duty width may make it difficult to sufficiently suppress the level of harmonics. In particular, with a reference clock CLK sent to the bus via a waveform shaping circuit constituted by analog circuits, the variation due to the analog circuitry is large, thus making it difficult to precisely control the duty width. In the CXPI communication, in addition to a reference clock CLK, an internally generated clock may be generated by a RC (resistor and capacitor) oscillator and used within an individual ECU, and typically a clock generated by the RC oscillator has a variation of ±30-40%. Therefore, it is preferred to control the duty width of the reference clock or the internal clock with high precision. The following embodiment relates to control of the duty width of the reference clock or the internal clock.

Figure 2A:
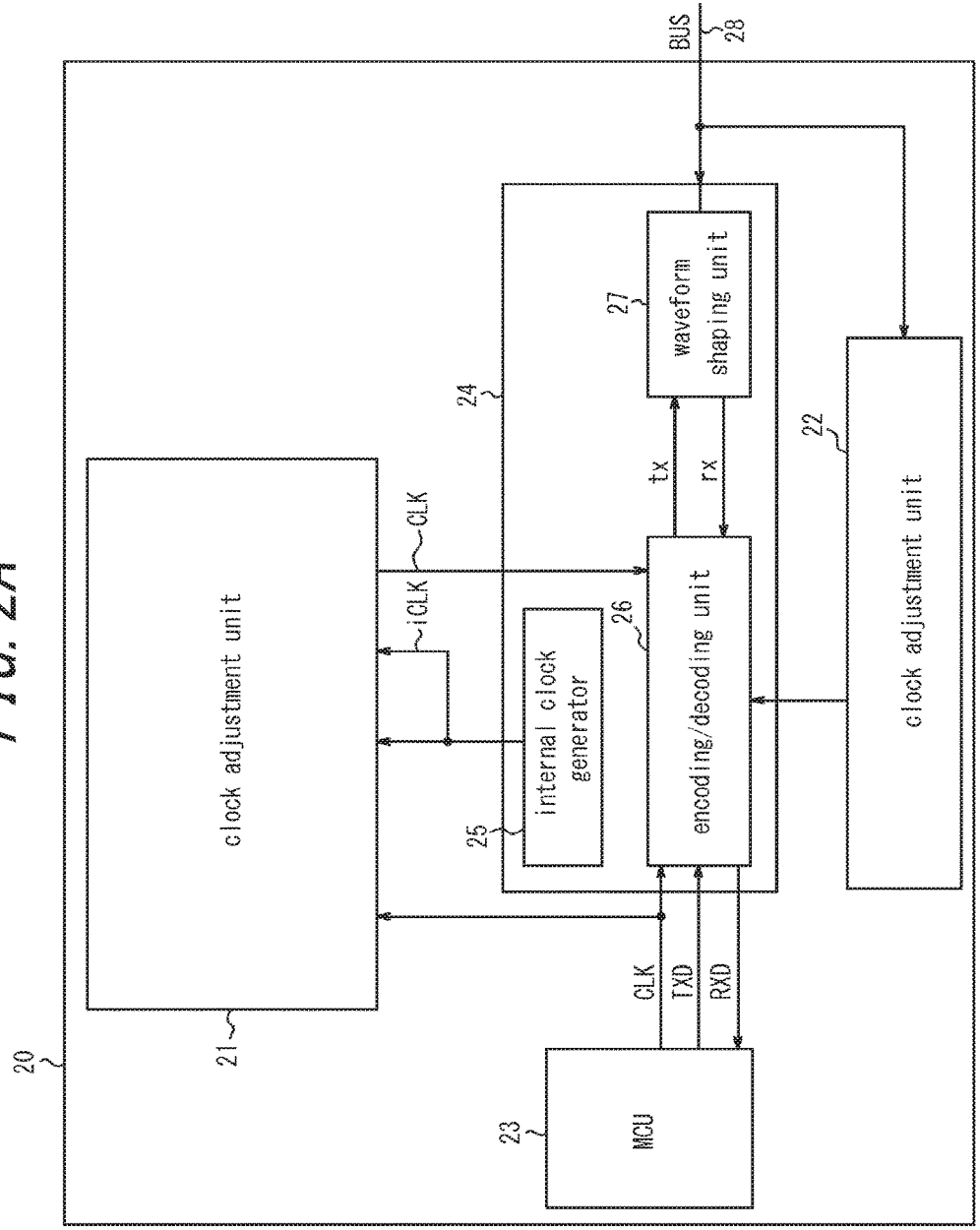
FIGS. 2A and 2B illustrate a configuration of an on-vehicle electronic device according to the first embodiment.
Figure 2B:
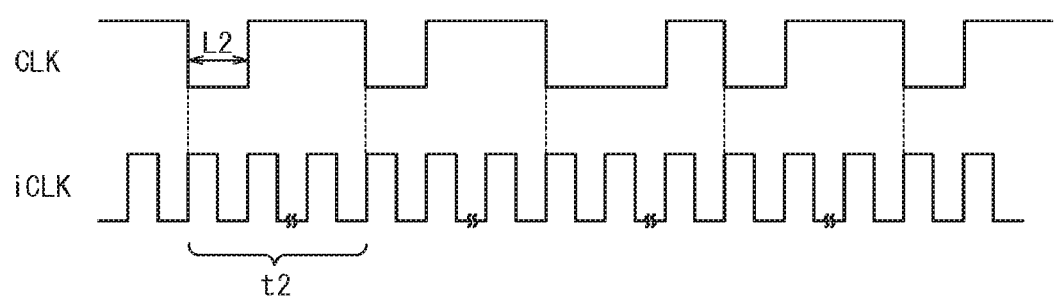

FIGS. 2A and 2B are diagrams illustrating a configuration of the on-vehicle electronic device of the present embodiment. The on-vehicle electronic device illustrated in FIG. 2A is, for example, a master node in the CXPI system, corresponding to the master node 10 illustrated in FIG. 1. Here, an ECU 20 is regarded as the on-vehicle electronic. The ECU 20 has an MCU 23 and a transceiver 24. The MCU 23 generates a reference clock CLK and transmits it, through the transceiver 24, to a bus 28. The MCU 23 of this embodiment corresponds to a "generating unit". The transceiver 24 has an internal clock generator 25, an encoding/decoding unit 26 and a waveform shaping unit 27. The MCU 23 transmits data (TXD) to and receives data (RXD) from other nodes, through the encoding/decoding unit 26, the waveform shaping unit 27 and the bus 28. The internal clock generator 25 generates a clock iCLK to be used within the ECU 20. Internal clock generator 25 has, for example, a RC oscillator, and generates the internal clock iCLK of high-frequency from the reference clock CLK.

The ECU 20 further has a clock adjustment unit 21. The clock adjustment unit 21 is provided with the reference clock CLK and the internal clock iCLK. Then, the clock adjusting unit 21, as illustrated in FIG. 2B, counts the number of clocks of the internal clock iCLK in one cycle t2 of the reference clock CLK. The clock adjustment unit 21 has, for example, a register for storing the input reference clock CLK and the internal clock iCLK, and a counter for counting each clock. The clock adjustment unit 21 may compute the average number of the clocks of the internal clock iCLK counted in clocks of the reference clock CLK.

The clock adjustment unit 21 adjusts the duty width L2 at the time of the reference clock CLK having a logical value "1", at a rate of the counted number (or the average number) of internal clock iCLK. For example, if the frequency of the internal clock iCLK is more than 100 times as large as the frequency of the reference clock CLK, the duty width of the reference clock CLK may be adjusted with an accuracy of less than 1%. Then, the clock adjusting unit 21 inputs the adjusted reference clock CLK to the transceiver 24. At the transceiver 24, the adjusted reference clock CLK is used by the encoding/decoding unit 26 for encoding the data to be transmitted, and the data is transmitted from the waveform generator 27 towards other nodes.

The ECU 20 may have a clock adjusting unit 22, instead of the clock adjusting unit 21. The clock adjustment unit 22 obtains the reference clock CLK, when transmitted from the waveform shaping unit 27 of the transceiver 24 towards the bus, and performs adjustment such that the duty width of the reference clock CLK with the logic value "1" is 14.9 μs. Or, the duty width of the reference clock CLK may be trimmed by using a storage device or the like, when tested.

Figure 3:
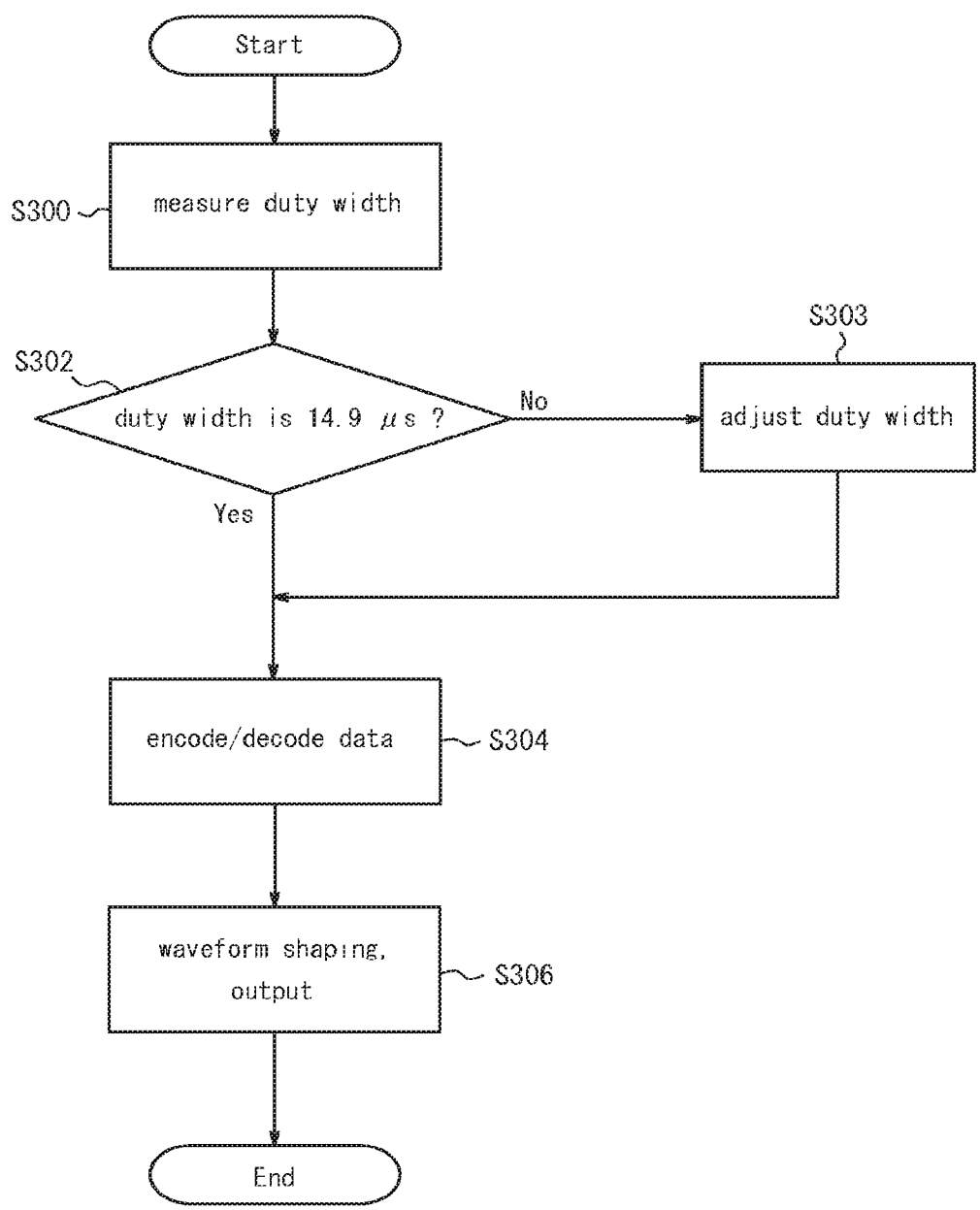
FIG. 3 is a flow chart diagram illustrating operations of an ECU.

FIG. 3 is a flowchart diagram for illustrating operations of the ECU 20 having the clock adjustment unit 22. The procedure of FIG. 3 begins when the clock adjusting unit 22 receives the reference clock CLK. The clock adjusting unit 22 measures the duty width of the reference clock CLK (S300). When the duty width is not 14.9 μs (S302 No), the clock adjusting unit 22 adjusts the duty width (S303), and sends the reference clock CLK to the encoding/decoding unit 26. Contrarily, when the duty width is 14.9 μs (S302 Yes), the clock adjusting unit 22, without adjusting the duty width, sends the reference clock CLK to the encoding/decoding unit 26. Then, the encoding/decoding unit 26 encodes the data using the reference clock CLK (S304), and the waveform shaping unit 27 sends the data encoded to the bus (S306).

In this embodiment, the ECU 20 may have one or both of the clock adjusting units 21 and 22. The configuration having the clock adjusting unit 21 enables relatively rougher adjustment, while the configuration having the clock adjusting unit 21 enables relatively finer adjustment. A configuration having both may enable more accurate adjustment than the configuration of having merely either of them.

The clock adjusting units 21 and 22, when adjusting the duty width of the reference clock CLK with the logical value "1", perform the first adjustment by relatively large adjustment width, then gradually adjust with smaller adjustment width than the first adjustment width.

Figure 4:
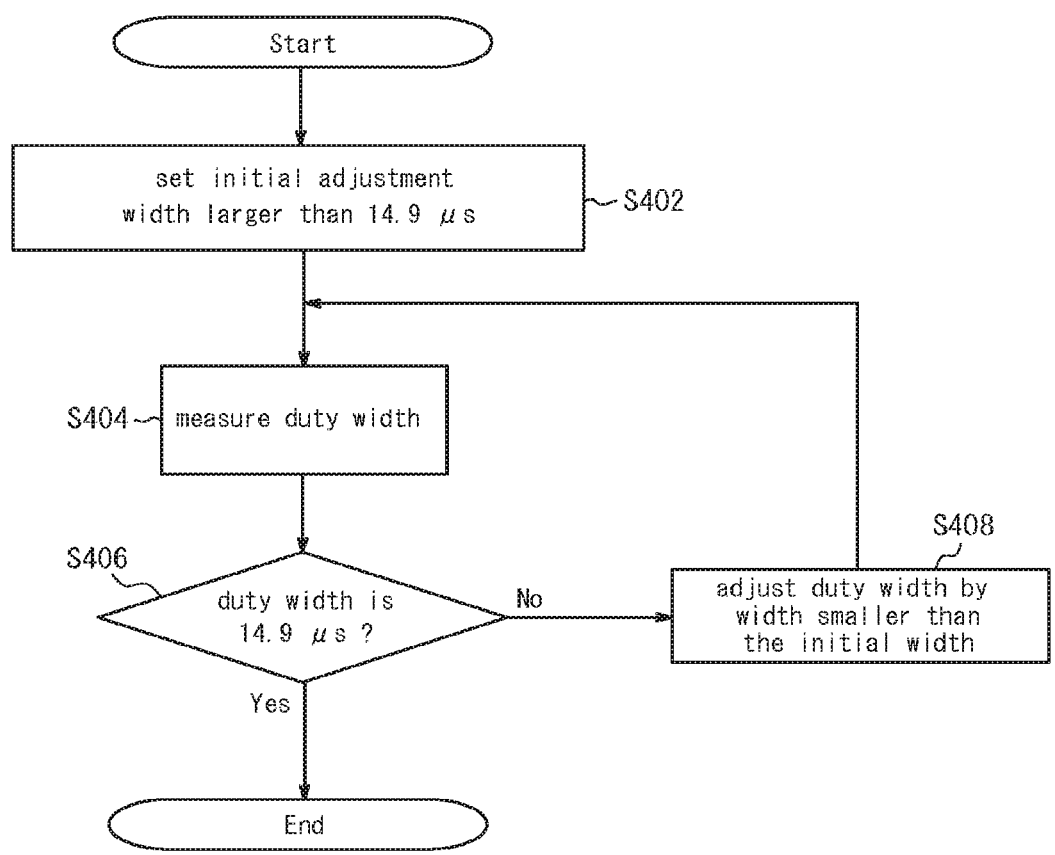
FIG. 4 is a flow chart diagram illustrating the operations of clock adjustment units.

FIG. 4 is a flowchart diagram illustrating operations of the clock adjusting units 21 and 22. After setting the adjustment width of the duty width at the initial width larger than 14.9 μs (S402), the clock adjustment units 21 and 22 measure the duty width (S404). When the duty width is not 14.9 μs (S406 No), the clock adjusting units 21 and 22 adjust the duty width by a width smaller than the initial width (S408), then the process returns to S404. On the other hand, when the duty width is 14.9 μs (S406 Yes), without the clock adjusting units 21 and 22 performing adjustment, the processing is terminated.

It is to be noted that, in the CXPI communication, a learning period of 20 ms is designated after the release of sleep mode and before the start of communication in accordance with the protocol specification, such that the logic value "1" is maintained during such the learning period. With that, since adjustment can be completed during the learning period, actual communication is not affected. Incidentally, waveform adjustment thereafter is not carried out until re-entering the sleep mode.

According to the first embodiment, since the duty width of the reference clock in the CXPI communication can be adjusted with high precision, interference with radio waves of the smart key system and other systems may be prevented. Moreover, even if using, instead of an expensive crystal oscillator or the like, an inexpensive RC oscillator which has greater variations, the duty width of the reference clock may be adjusted with high precision. Thus, simplification of circuit and low cost may be achieved.

Second Embodiment

The second embodiment is to prevent interference between the radio waves of the reference clock and the smart key system in the CXPI communication system, taking into consideration spread spectrum method as means to reduce the level of harmonics in the 134 kHz band. The spread spectrum method may prevent the power of the reference clock from being concentrated in a specific frequency band, thus enabling suppressing the level of harmonics in the 134 kHz band. However, when employing the spread spectrum method, the following may be concerned.

In the spread spectrum systems, a frequency of several kHz to several tens kHz is generally used as a modulation frequency for spreading spectrum. This is because, in a spread spectrum clock generator, the band lower than several kHz are removed by the feedback control of a phase comparator. Then, the power is suppressed by the spread spectrum only in a relatively high frequency band, while in a low frequency band, particularly in the band of several kHz to several tens kHz, the power of the modulation wave is superimposed, thus the power being not sufficiently suppressed. The reference clock of the bus of CXPI communication is 20 kHz, overlapping with several kHz to several tens kHz of the modulation wave. Thus, the effectiveness of reducing the interference between radio waves of the bus reference clock and the smart key system remains low.

Further, even if the modulation wave may be sufficiently lowered, in an environment where the harmonics of 9 kHz to 150 kHz are observed, according to regulations CISPR (Comité international spécial des perturbations radioélectriques), the resolution frequency for spreading spectrum is required to be set to 200 Hz. Thereby, after all, the resolution frequency is superimposed on the modulated wave, and the power reduction effect of the harmonics of the 134 kHz band is lowered.

In view of the above circumstances in the spread spectrum method, the second embodiment relates to reducing the level of harmonics of the desired band (134 kHz), when the following [Formula 1] is satisfied.

$$RBW < SSMF < TF \times SSMR, \text{ wherein} \quad \text{[Formula 1]}$$

RBW: resolution frequency,
SSMF: modulation frequency,
TF: suppression target frequency (134 kHz) and
SSMR: modulation rate (1% in the CXPI communication). The second embodiment relates to performing a spread spectrum process on a reference clock at a modulation frequency that satisfies the above [Formula 1]. Further, this embodiment relates to a modified example of, with respect to the configuration illustrated in FIG. 2, the clock adjusting unit 21 and the transceiver 24.

Figure 5:
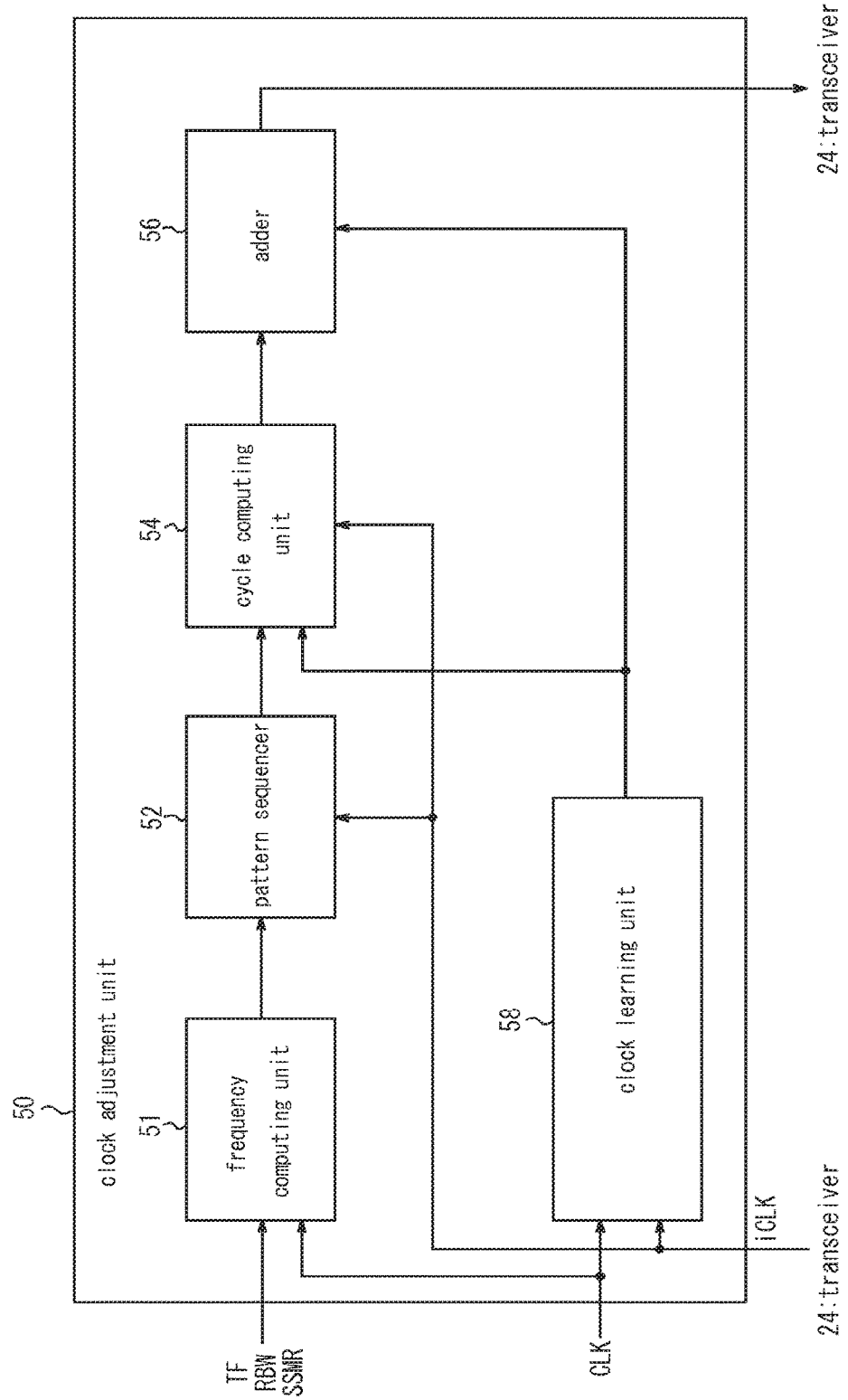
FIG. 5 is a diagram illustrating the configuration of a clock adjustment unit in the second embodiment.

FIG. 5 is a diagram illustrating a configuration of a clock adjusting unit in this embodiment. The clock adjustment unit 50 has modules such as a frequency computing unit 51, a pattern sequencer 52, a cycle computing unit 54, an adder 56 and a clock learning unit 58.

The clock learning unit 58, when an internal clock iCLK (e.g., 4 MHz) generated by the transceiver 24 is input, counts the clocks of the internal clock iCLK per one clock of the reference clock CLK (e.g., 20 kHz). Then, the count result (e.g., 200) is sent to the adder 56 and the cycle computing unit 54.

The frequency computing unit 51 is provided with input of a resolution frequency RBW (e.g., 200 Hz) for noise evaluation, a suppression target frequency TF (134 kHz), a modulation factor SSMR (e.g., 0.5%) and the reference clock CLK, and computes the modulation frequency SSMF (e.g., 300 Hz) on the basis of these factors. The frequency computing unit 51 sends to the pattern sequencer 52 the resolution frequency RBW, the suppression target frequency TF, the modulation rate SSMR, the reference clock CLK, and the modulation frequency SSMF.

The pattern sequencer 52 generates modulation patterns of (±0.5, ±0) based on the modulation factor SSMR, and sends the pattern to the cycle computing unit 54 along with the resolution frequency RBW, the suppression target frequency TF, the modulation rate SSMR, the reference clock CLK and the modulation frequency SSMF.

Figure 6A:
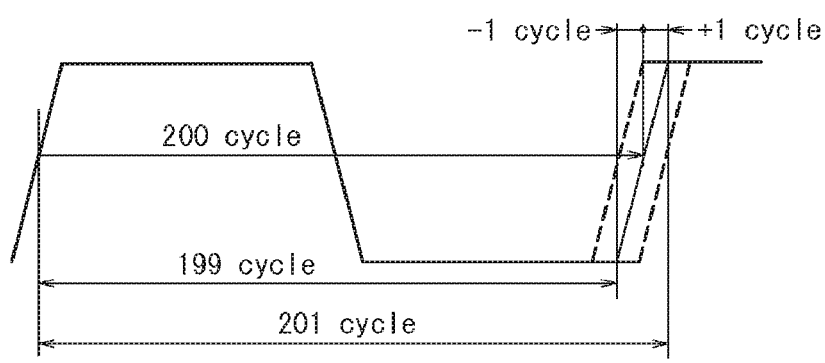
FIGS. 6A and 6B are diagrams illustrating an example of a reference clock.

The cycle computing unit 54, by applying the modulation pattern (±1, ±0) to the clock count of the internal clock iCLK per one clock of the clock CLK, derives the modulation cycle. FIG. 6A illustrates a modulation cycle to be derived. For example, in every cycle of 3.33 ms corresponding to the spread spectrum modulation frequency of 300 Hz, the cycle computing unit 54 performs computation of +1, ±0 and −1, to the clock count 200 of the internal clock iCLK, and respectively derives the modulation cycles 201, 200 and 199, in the clock count of the internal clock iCLK. The derived modulation cycles are sent to the adder 56.

Figure 6B:
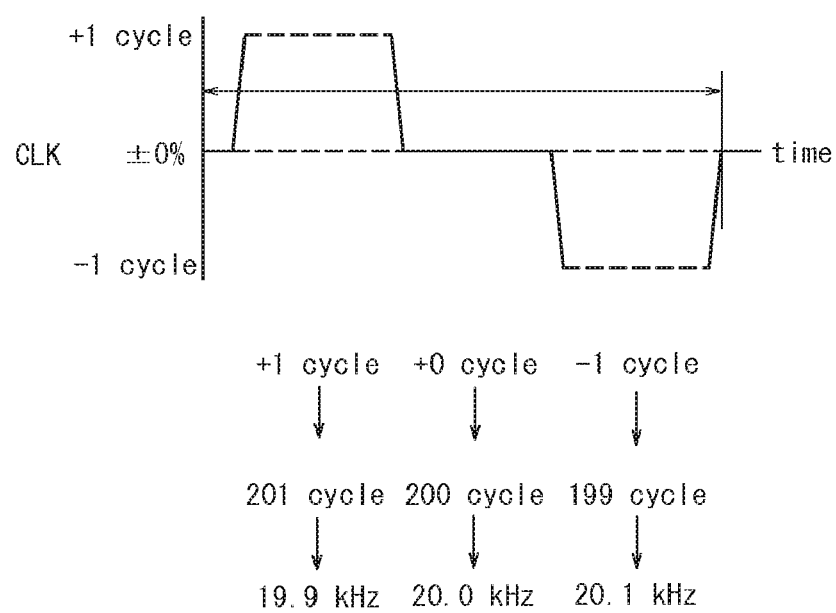

The adder 56 applies the modulation cycles to the reference clock CLK, changing the frequency of the reference clock, 19.9 kHz, 20.0 kHz and 20.1 kHz for each modulation cycle, and sends them to the transceiver 24. In this case, examples of the reference clock CLK are illustrated in FIG. 6B.

In FIG. 5, an example is depicted that the clock adjusting unit 50 has modules such as the frequency computing unit 51, the pattern sequencer 52, the cycle computing unit 54, the adder 56 and the clock learning unit 58; however, a part or the entirety of the clock adjusting unit 50 may be implemented in analog circuitry. For example, the cycle computation unit 54 and the adder 56 may be configured using a plurality of delay circuits for delaying the reference clock CLK for each modulation pattern and a selector which selects and outputs one of input from the plurality of delay circuits according to a signal from the pattern sequencer 52.

Figure 7:
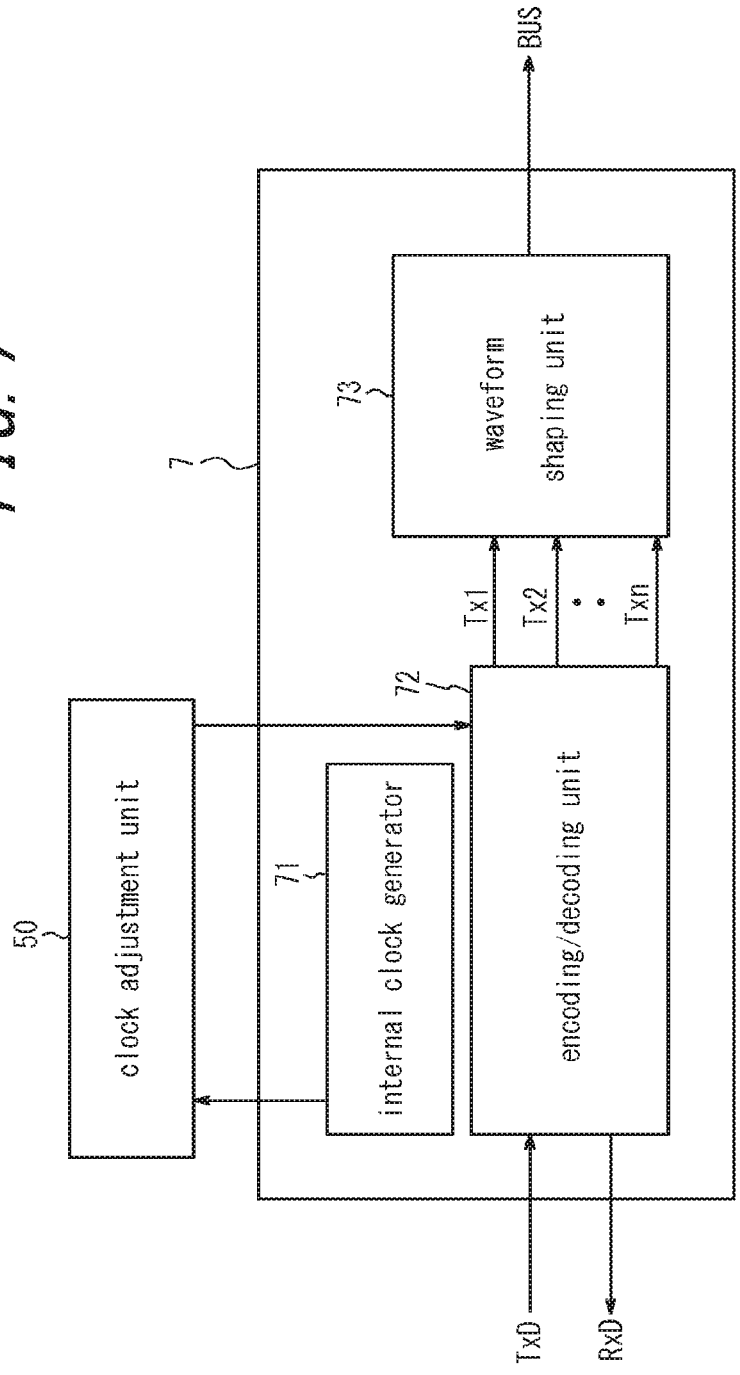
FIG. 7 is a diagram illustrating a configuration of a transceiver.

FIG. 7 illustrates a configuration of the transceiver in this embodiment. The transceiver 7 has an internal clock generator 71 for generating the internal clock iCLK, an encoding/decoding unit 72 for performing, in accordance with the reference clock CLK of which the spectrum are spread, encoding/decoding of data (TXD, RXD) that the MCU transmits/receives, and a waveform shaping unit 73 for sending the encoded data towards the bus.

Figure 8:
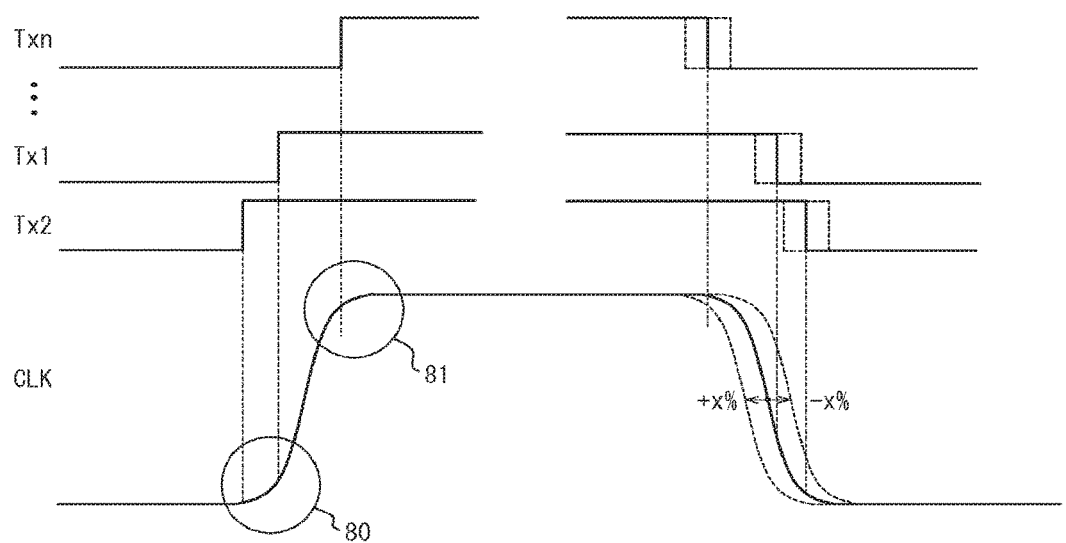
FIG. 8 is a diagram illustrating an example of a reference clock.

FIG. 8 illustrates an example of the reference clock CLK the waveform shaping unit 73 outputs. The waveform shaping unit 73 outputs the reference clock CLK, for example, by rounding the edges (80, 81) of the reference clock CLK using a filter. This example depicts spread spectrum with a modulation factor of ±X % to the reference clock CLK with rounded edges. By rounding the edges, the levels of the harmonics may be suppressed.

Third Embodiment

In the CXPI communication system, a transceiver of a slave node lowers edges of the internal clock generated itself in sync with falling edges of the reference clock. Thereby, the slave node performs processing in sync with the processing logic of the master node. If the fall of the internal clock of the slave node is dull, that is, the slew rate is high, unexpected spike noise is superimposed to the reference clock and causes deterioration of communication quality. As the slew rate increases, noise resistance becomes worse. The third embodiment is to address such a problem, relating to a transceiver for the slave node side and the master node side.

Figure 9:
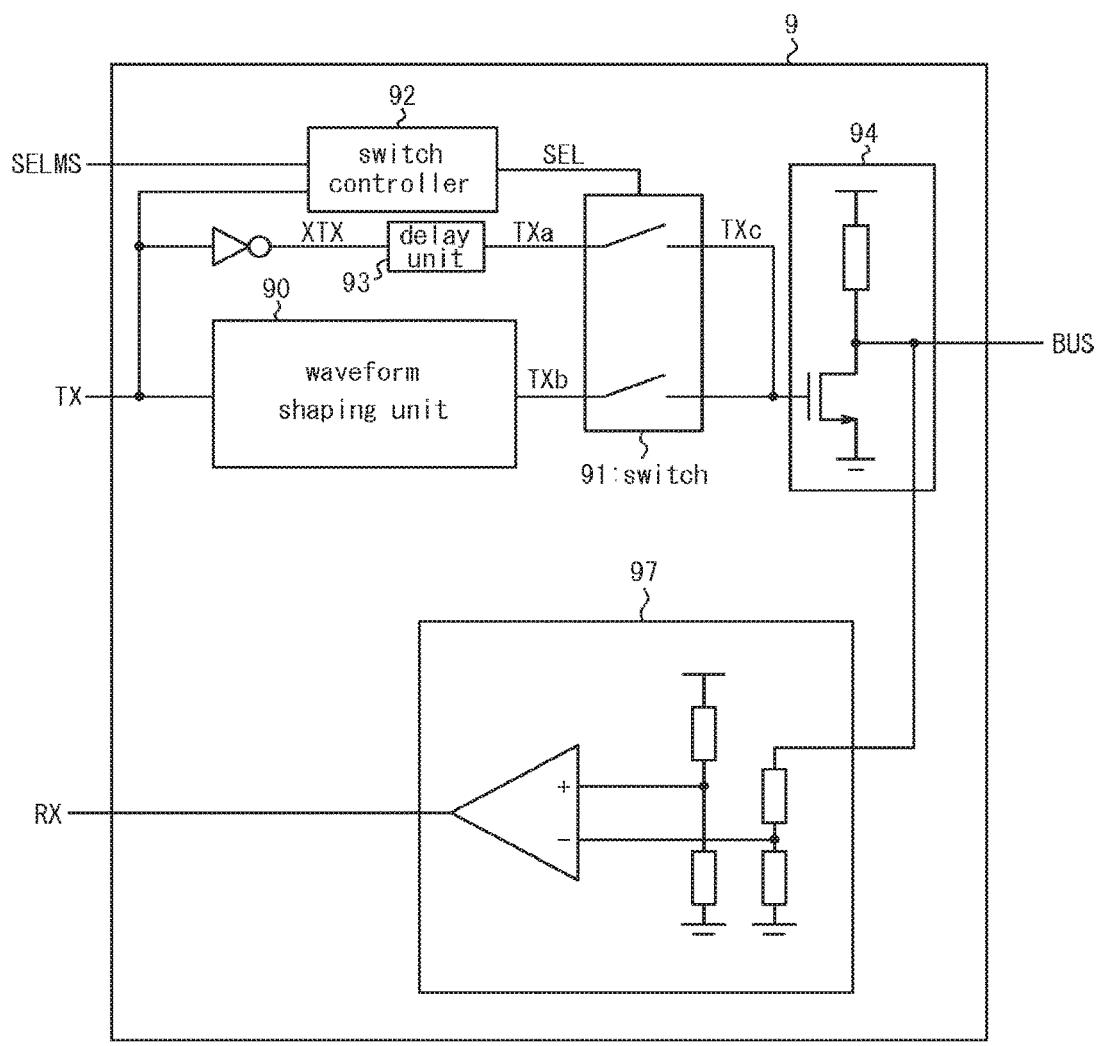
FIG. 9 is a diagram illustrating a configuration of the transceiver of a slave node in the third embodiment.

FIG. 9 illustrates a configuration of a transceiver of a slave node. The transceiver 9 corresponds, in the configuration of the master node and the slave node illustrated in FIG. 1, to the transceiver 104. The transceiver 9 has a waveform shaping unit 90, a switch 91, a switch controller 92, a delay unit 93, an interface 94 and an input unit 97.

Figure 10:
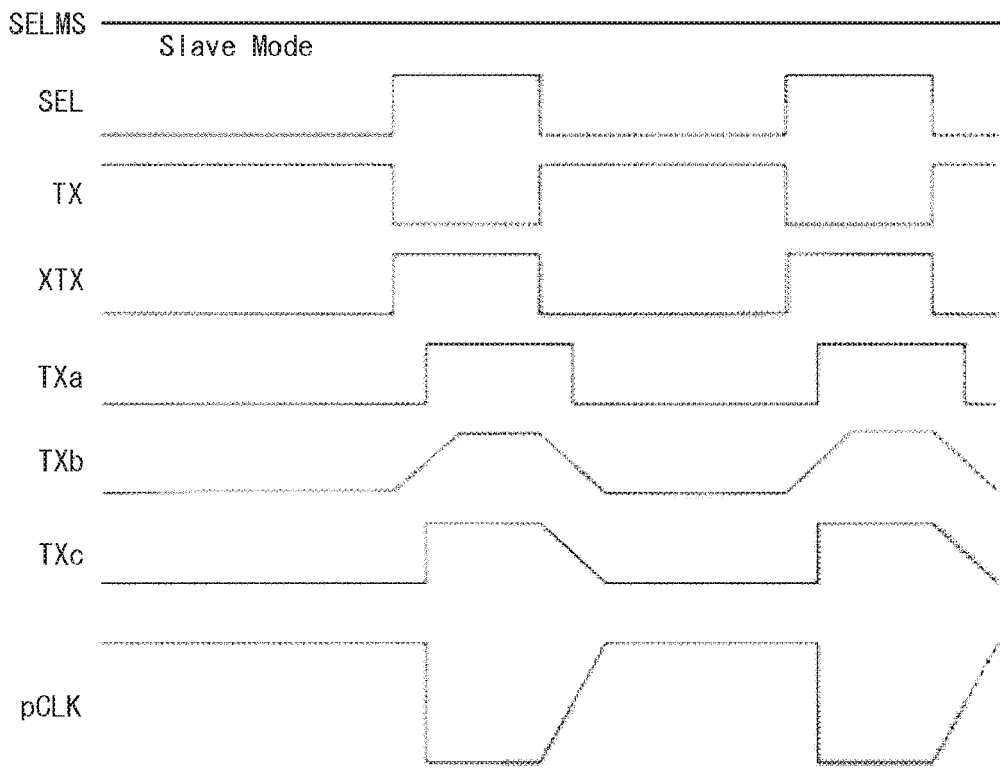
FIG. 10 is a diagram illustrating signals input to and output from a transceiver.

The operations of the units depicted in FIG. 9 will be described with reference to FIG. 10. FIG. 10 illustrates signals to be input to and output from the units depicted in FIG. 9.

The waveform shaping unit 90 takes in transmission data TX, to generate a data signal TXb of a low slew rate.

The delay unit 93 delays by Δd the inverted signal XTX of the transmission data TX, and sends it as data signal TXa to the switch 91.

The switch controller 92 detects that the ECU is operating as a slave node based on a signal SELMS from the MCU, and sends a selector signal SEL to the switch 91. The switch controller 92 sends such the selector signal SEL to the switch 91 as to make the switch 91 select data signal TXa when the transmission data TX falls from high to low, or data signal TXb when the transmission data TX rises from low to high.

The switch 91, in response to the selector signal SEL, selectively outputs data signals TXa or TXb as a signal TXc. As a result, the signal TXc sharply rises (i.e., at a low slew rate) in sync with the rise of the data signal TX, or slowly falls (i.e., at a high slew rate) in sync with the falling edge of the data signal TX. The signal TXc is sent to the interface 94.

The interface 94, in response to the signal TXc, generates and outputs a clock pCLK which is at the high level when the signal TXc is at the low level, or at the low level when the signal TXc is at the high level. Then, this clock pCLK is superimposed on the reference clock CLK received via the bus from the master node.

Figure 11A:
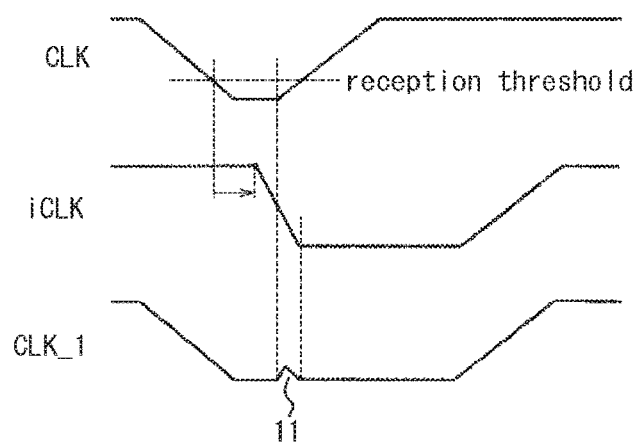
FIGS. 11A-11C are diagrams illustrating signals input to and output from a transceiver.
Figure 11B:
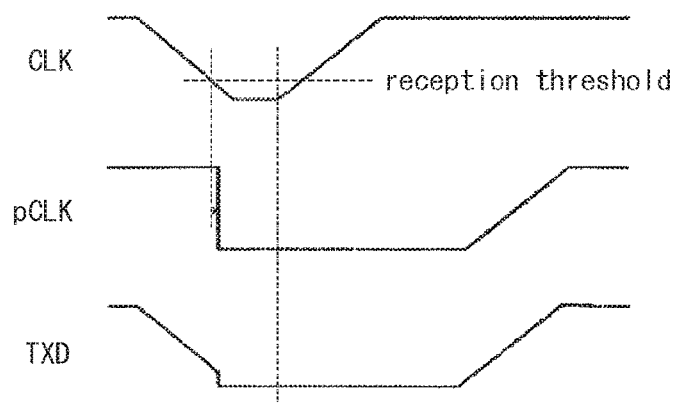
Figure 11C:
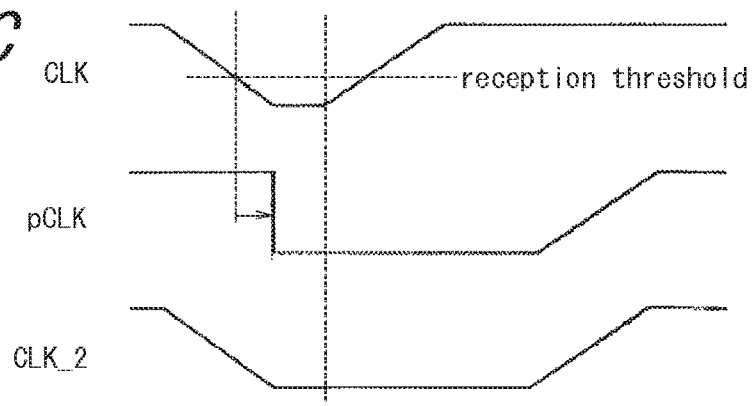

FIGS. 11A-11C are diagrams for illustrating cases where the internal clock of the slave node is superimposed on the reference clock CLK. FIG. 11A illustrates a reference clock CLK, an internal clock iCLK and a reference clock CLK 1 to which the internal clock iCLK is superimposed, in the case of this embodiment is not applied. FIGS. 11B and 11C illustrate the reference clock CLK of the present embodiment, the clock pCLK generated by the transceiver, a reference clock CLK 2 to which the clock pCLK is superimposed.

As illustrated in FIG. 11A, when the internal clock iCLK has dull falling with a high slew rate, the timings of the reference clock CLK and the internal clock iCLK becoming low do not match each other, and a spike 11 occurs in the reference clock CLK 1. On the other hand, as illustrated in FIG. 11B, by lowering the slew rate of the clock pCLK to fall sharply, the timings of the reference clock CLK and the clock pCLK for becoming low match, the spike in the reference clock CLK 1 may be prevented.

In the CXPI, communication in 20 Kbps is performed, and the maximum slew rate is restricted to 5V/μs. In a preferred example, in view of the delay time corresponding to the slew rate of 5V/μs being 2.4 μs, the time for delaying the data signal TX at the delay unit 93 is set to 1-2 μs. If the delay time is too short, as illustrated in FIG. 11C, the clock pCLK becomes the low level before the reference clock CLK becomes the low level, and thus accuracy of the reference clock CLK 1 is deteriorated. However, as described above, by setting an appropriate delay time, the occurrence of spikes in the reference clock may be prevented, and preferable signal accuracy may be maintained.

In the case of configuring the delay circuit of the delay unit 93 by using a resistor and a capacitor, by measuring the time that the reference clock CLK transits between high/low detection thresholds on the voltage level, the slew rate may be computed based on the measured transition time and a battery voltage (e.g., 12V). Then, based on the computed slew rate, the transition time from a low detection of the reference clock CLK to 0V may be computed, and on the basis of the computed transition time, RC time constant of the delay circuit may be appropriately set.

In a modified example of this embodiment, in place of the master node, one of slave nodes generates the reference clock CLK and sends it towards the bus of the CXPI communication network. The transceiver 9 illustrated in FIG. 9 operates to output a signal which will be illustrated in FIG. 12.

Figure 12:
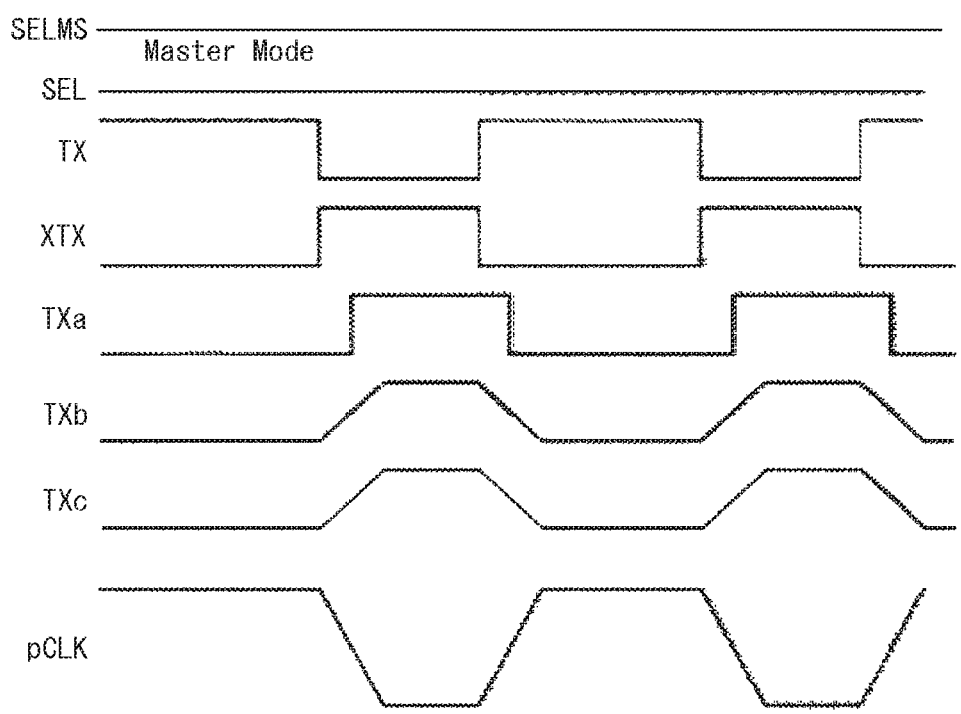
FIG. 12 is a diagram illustrating signals input to and output from the transceiver.

FIG. 12 illustrates signals, in the modified example, input to and output from the units depicted in FIG. 9. With reference to FIG. 12, operations of the units in the modified example will be described.

The operations of the waveform shaping unit 90 and the delay unit 93 are the same as in FIG. 10.

The switch controller 92 detects that the ECU operates as the master mode based on the signal SELMS from the MCU, and sends a selector signal SEL to the switch 91. In this modified example, the selector signal SEL is always at the low level. As a result, the switch 91 outputs the waveform-shaped data signal TXb as a signal TXc. As a result, the edges of the signal TXc rise and fall at a relatively high slew rate. The signal TXc is sent to the interface 94 and sent out as the reference clock CLK.

Fourth Embodiment

Figure 13A:
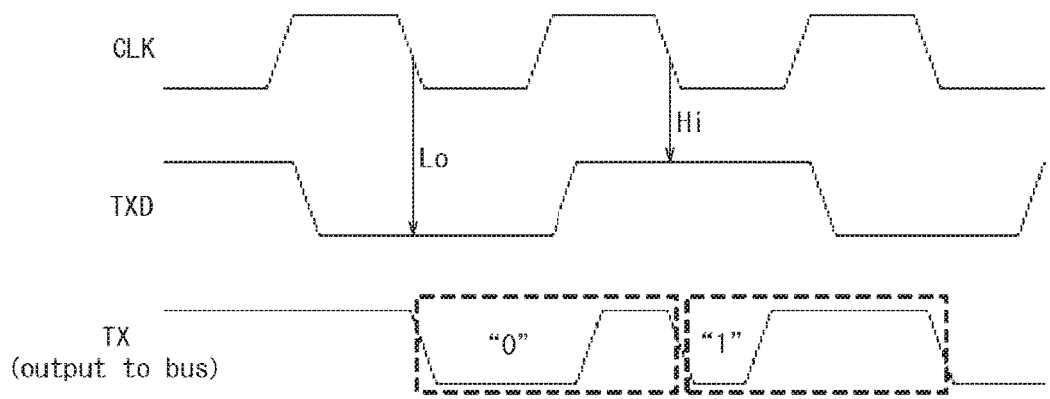
FIGS. 13A and 13B are diagrams illustrating the relationship of a data signal and a reference clock.

In the master node of the CXPI communication, an MCU sends to a transceiver a data signal of the high level or the low level in sync with the reference clock. Then, the transceiver, in accordance with the reference clock received from the MCU, modulates the pulse width of the data signal. For example, as illustrated in FIG. 13A, the transceiver generates, at a timing of the falling edge of the clock CLK, a high duty-ratio data signal TX corresponding to the value "1" when the data signal TXD is at the high level, or a low duty-ratio data signal TX corresponding to the value "0" when the data signal TXD is at the low level, and sends the data signal TX to the bus.

Figure 13B:
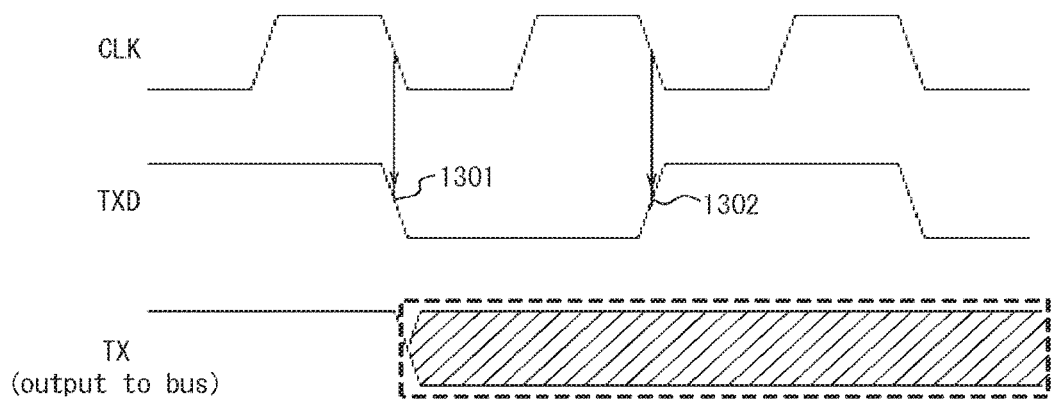

With the MCU, generation and transmission of a reference clock and serial transfer of the data signal are each implemented in separate macros, which operate separately from each other. Therefore, when the transceiver is to process the data signal using the reference clock received from the MCU, there may be a case where the received reference clock and data signal are not synchronized, and the correct data cannot be sent out. For example, as illustrated in FIG. 13B, when the falling edge of the reference clock CLK corresponds to the middle of the falling or rising of the edge of the data signal TXD (1301, 1302), the level of the data signal TXD cannot be determined as whether high or low, and thus accurate data signal TX cannot be generated.

In the CXPI communication, data communication between the MCU and the transceiver is carried out in the unit of 10 bits in total, by adding identification bits before and after one byte data. At this time, in the transceiver, bit arbitration is carried out. In case of failure of arbitration, the transceiver immediately stops delivery of the data signals to the bus. In that case, due to such a designation by the CXPI, correct data cannot be transmitted by the transceiver in the situations as described above, the data communication may be aborted thus reducing the throughput. Therefore, it is preferred to provide the MCU with a module for controlling the synchronization of the reference clock and data signals. However, such an addition of a module may incur a risk of increasing the MCU processing load.

Also, the slave node transmits and receives data signals using the reference clock received from the master node via the bus. The MCU of the slave node receives from the transceiver the reference clock received from the bus, and control processing takes place such that the MCU operates in sync with the reference clock. Providing such a control module, however, may increase the MCU processing load. Alternatively, for example, adding a pin to deliver a reference clock between a transceiver and the MCU may be possible, but this leads to the complication of the circuit.

In light of the above, the present embodiment relates to a transceiver of the master node or a slave node of the CXPI communication, which may enable accurate data communication, even though the reference clock and the data signal operate asynchronously.

Figure 14:
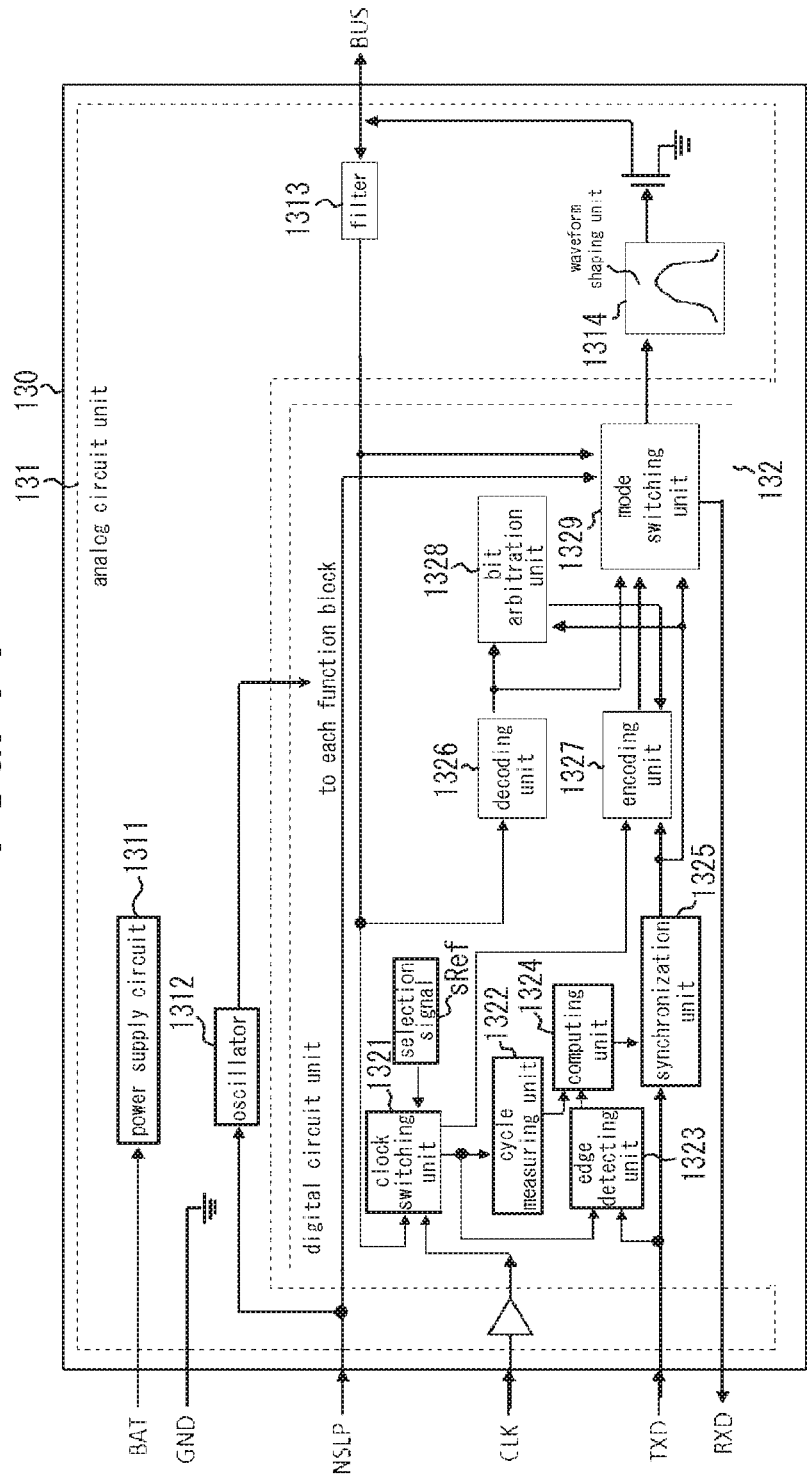
FIG. 14 is a diagram illustrating a configuration of a transceiver of master/slave nodes in the fourth embodiment.

FIG. 14 illustrates a configuration of a transceiver of the master node or a slave node. The transceiver 130 has an analog circuit unit 131 and a digital circuit unit 132.

The analog circuit unit 131 has a power supply circuit 1311 for obtaining the power from a battery, an oscillator 1312, which is activated by an enable signal NSLP to supply a clock signal to the digital circuit unit 132, a filter 1313 to remove noise in signals received from the bus, and a waveform shaping unit 1314 for shaping the waveform of the signal to be transmitted to the bus.

The digital circuit unit 132 has a clock switching unit 1321, a cycle measuring unit 1322, an edge detecting unit 1323, a computing unit 1324, a synchronization unit 1325, a decoding unit 1326, an encoding unit 1327, a bit arbitration unit 1328, and a mode switching unit 1329.

The clock switching unit 1321 determines whether the device is the master node or a slave node, based on the selection signal sRef. Then the clock switching unit 1321 selects as the baud rate a reference clock CLK sent from the MPU (Microprocessor Unit) in the case of the master node, or a reference clock sent from the master node via the bus in the case of the slave node. The selected baud rate is sent to the cycle measuring unit 1322 and the edge detecting unit 1323. In the present embodiment, the reference clock selected as the baud rate will be hereafter referred to as a "baud rate clock".

Figure 15A:
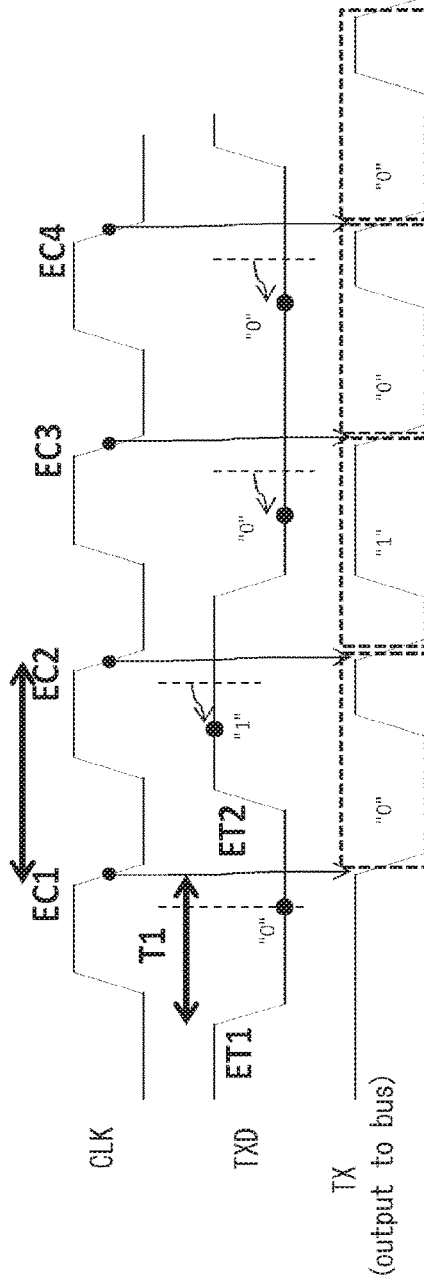
FIGS. 15A and 15B are diagrams illustrating the relationship of a data signal and a reference clock.
Figure 15B:
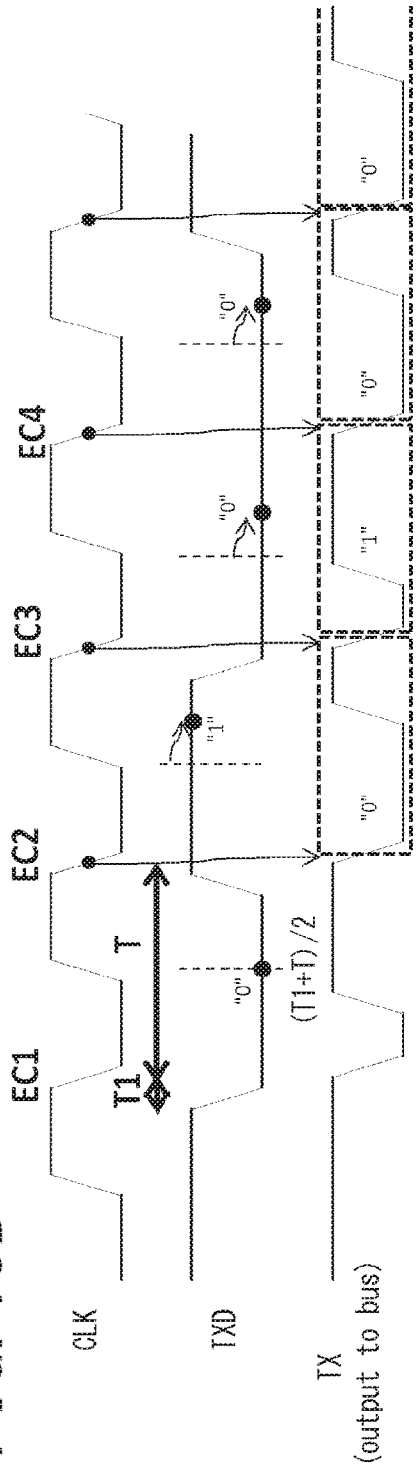

Here, referring to FIGS. 15A, 15B, and 16, operations of the cycle measuring unit 1322, the edge detecting unit 1323, the computing unit 1324, the synchronization unit 1325, decoding unit 1326, the encoding unit 1327, the bit arbitration unit 1328, and the mode switching unit 1329 will be described. FIGS. 15A and 15B illustrate a data signal TXD input from the MPU, baud rate clock bCLK and the data signal TX for output. In FIGS. 15A and 15B, there are illustrated falling edges EC1, EC2, . . . of the baud rate clock and a falling edge ET1 and a rising edge ET2 of the starting bit of the data signal TXD. FIG. 16 is a flowchart for illustrating operations of the units.

Referring to FIG. 16 in conjunction with FIG. 15A, the cycle measuring unit 1322 measures the cycle T of the baud rate clock bCLK (S160). For example, a RC oscillator is used for the measurement. The measurement results are sent to the computing unit 1324.

The edge detecting unit 1323 detects the falling edge ET1 of the first bit of the data signal TXD sent from the MPU (S161), and detects the falling edge EC2 of the baud rate clock bCLK (S162), to detect the time period T1 from the falling edge ET1 of the data signal TXD until the falling edge EC1 of the baud rate clock bCLK, i.e., to detect the phase difference (S163). In a preferred example, the edge detecting unit 1323 may detect the time period T1 in a plurality of times to compute the average. Thereby, the time period T1 may be detected with higher accuracy. The edge detecting unit 1323 also excludes shorter clocks below a predetermined lower limit and longer clocks over a predetermined upper limit from the samples. Thereby, impact of noise may be eliminated.

The computing unit 1324 determines whether accurate data TX can be output in accordance with the baud rate clock bCLK. To be more concrete, the computing unit 1324 determines whether or not the time period T1 from the falling edge ET1 of the data signal TXD to the falling edge EC1 of the baud rate clock bCLK is greater than 50% of the cycle T of the baud rate clock (S164).

If the time period T1 is greater than 50% of the period T (S164 Yes), the computing unit 1324 determines that data signal TXD can be captured at the falling edge EC1 (S165), and computes the following data capturing timing TS (S166) by the following formula.

$$TS=EC1+T1/2$$

Then, the synchronization unit 1325 captures, at the capturing timing TS, the value of the data signal TXD, i.e., the value "0" corresponding to the low level or the value "1" corresponding to the high level (S167), and outputs the captured data as the data signal TX at the subsequent falling edge of the baud rate clock bCLK, to the encoding unit 1327 and the bit arbitration unit 1328 (S168).

The computing unit 1324 determines whether or not the processing of the ending bit is completed (S169), and if the ending bit was processed (S169 Yes), the process is terminated. On the other hand, if the ending bit was not processed (S169 No), the computing unit 1324 updates the capturing timing TS in the following cycle by the following formula (S171).

$$TS=TS+T$$

As a result, the data capturing timing may be obtained which is shifted from the edge of the baud rate clock bCLK. Then, the process returns to the step S166.

At the step S164, in the case that it is determined that accurate data TX cannot be output in accordance with the baud rate clock bCLK, that is, the time period T1 from the falling edge ET1 of the data signal TXD to the falling edge EC1 of the baud rate clock bCLK is less than 50% of the cycle T of the baud rate clock (S164 No), the process proceeds to the step S170. In this case, the baud rate clock bCLK and the data signal TXD and TX are illustrated in FIG. 15B. In this case, the computing unit 1324 computes the following data capturing timing TS by the following formula (S170).

$$TS=EC1+(T1+T)/2$$

Then, the synchronization unit 1325 captures the value of the data signal TXD at the capturing timing TS (S167), and outputs is as the data signal TX at the subsequent falling edge of the baud rate clock bCLK to the encoding unit 1327 and the bit arbitration unit 1328 (S168).

By the above-described procedure, when accurate data TX can be output in accordance with the baud rate clock bCLK, that is, the time period T1 from the falling edge ET1 of the data signal TXD to the falling edge EC1 of the baud rate clock bCLK is longer than 50% of the cycle T of the baud rate clock bCLK, the following processing is carried out. As illustrated in FIG. 15A, at the starting bit, the value "0" of the data signal TXD of the edge EC1 is captured and output as the data signal TX at the timing of the edge EC1. Then, after the starting bit, the values of the data signal TXD, "1", "0", . . . are captured respectively at the timings (EC1+T1/2), (EC2+T1/2), . . . , and output as the data signal TX, respectively at the timings of the edges EC2, EC3, . . . .

On the other hand, when accurate data TX cannot be output in accordance with the baud rate clock bCLK, that is, the time period T1 is equal to or less than 50% of the cycle T, the following processing is carried out. As illustrated in FIG. 15B, at the starting bit, the value "0" of the data signal TXD is captured at the timing (EC1+(T1+T)/2) and output as the data signal as TX at the timing of the edge EC2. Then, similarly, the values of the data signal TXD, "1", "0", . . . are captured respectively at the timings, (EC2+(T1+T)/2), (EC3+(T1+T)/2), . . . , and output as the data signal TX respectively at the timings of the edges EC3, EC4, . . . .

Note that, in a modification of the step S171 for updating the capturing of timing TS in the subsequent cycle, formulas other than those described above may be used. For example, when accurate data TX can be output in accordance with the baud rate clock bCLK, that is, the time period T1 is longer than 50% of the cycle T, the following formula may be used.

$$TS=TS+T\times 3/4$$

On the other hand, when accurate data TX cannot be output in accordance with the baud rate clock bCLK, that is, the time period T1 is equal to or less than 50% of the cycle T, the following formula may be used.

$$TS=TS+T\times 5/4$$

Returning to FIG. 14, the bit arbitration unit 1328 returns to the encoding unit 1327 a bit arbitration result of the data signal TX transmitted from the synchronization unit 1325. The encoding unit 1327 forwards, in sync with the baud rate clock bCLK sent from the clock switching unit 1321, the data signal TX transmitted from the synchronization unit 1325 to the mode switching unit 1329, on condition that the bit arbitration was made. The mode switching unit 1329 proceeds to the normal mode by the enable signal NSLP, and sends the encoded data signal TX to the waveform shaping unit 1314. Then, the data signal TX is transmitted to the bus via the waveform shaping unit 1314.

Incidentally, the signal obtained from the bus and then through the filter 1313 is sent to the clock switching unit 1321 and the decoding unit 1326. In this way, the clock switching unit 1321 obtains the reference clock sent from the master node via the bus. On the other hand, the decoding unit 1326 decodes the received data signal and sends it to the bit arbitration unit 1328 and a mode switching unit 1329. The mode switching unit 1329, at the normal mode, outputs to the MPU decoded data signal as the data signal RVD.

According to this embodiment, the reference clock and data signals are generated even asynchronously by the MPU of the master node, the correct data signal can be sent to the bus.

Fifth Embodiment

In the CXPI communication system, the master node ECU and slave node ECU each operate in modes such as a normal mode, a sleep mode and a standby mode. In the normal mode, the ECU performs encoding/decoding of data signals and data communication on the network. The ECU transits from the normal mode to the sleep mode, when the condition for the sleep mode is met in the case of the ECU being the master node, or when receiving a sleep frame from the master mode in the case of the ECU being a slave node. During the sleep mode, the ECU stops encoding/decoding of the data signals and the data communication, to reduce the power consumption. During the sleep mode, if there arises a wake-up factor, each ECU will transit to the standby mode. The standby mode is a transition mode from the sleep mode to the normal mode, and, during the standby mode, the ECU performs data transmission/reception on the network, without encoding/decoding the data signals.

When a master node and a slave node are both in the sleep mode, there can be a case that the slave node transits to the standby mode before the master node and sends a wake-up signal to the master node. The master node, being activated by the wake-up signal, transits through the standby mode to the normal mode, and sends a PWM encoded reference clock to the bus. Then, the slave node receives the reference clock via the bus. In this case, if the slave node is still at the standby mode, the transceiver of the slave node may forward the reference clock without decoding to the MCU. Thus, the MCU may not be able to receive the reference clock, and malfunctions may occur. Alternatively, the transceiver may prevent the MCU from a malfunction by stopping forwarding the reference clock to the MCU. Even in that case, however, the MCU is unable to detect the input of the reference clock, thus unable to cancel the standby mode and remaining therein.

In view of the above, the present embodiment relates to a slave node which avoids a malfunction even when receiving the reference clock during the standby mode.

Figure 17:
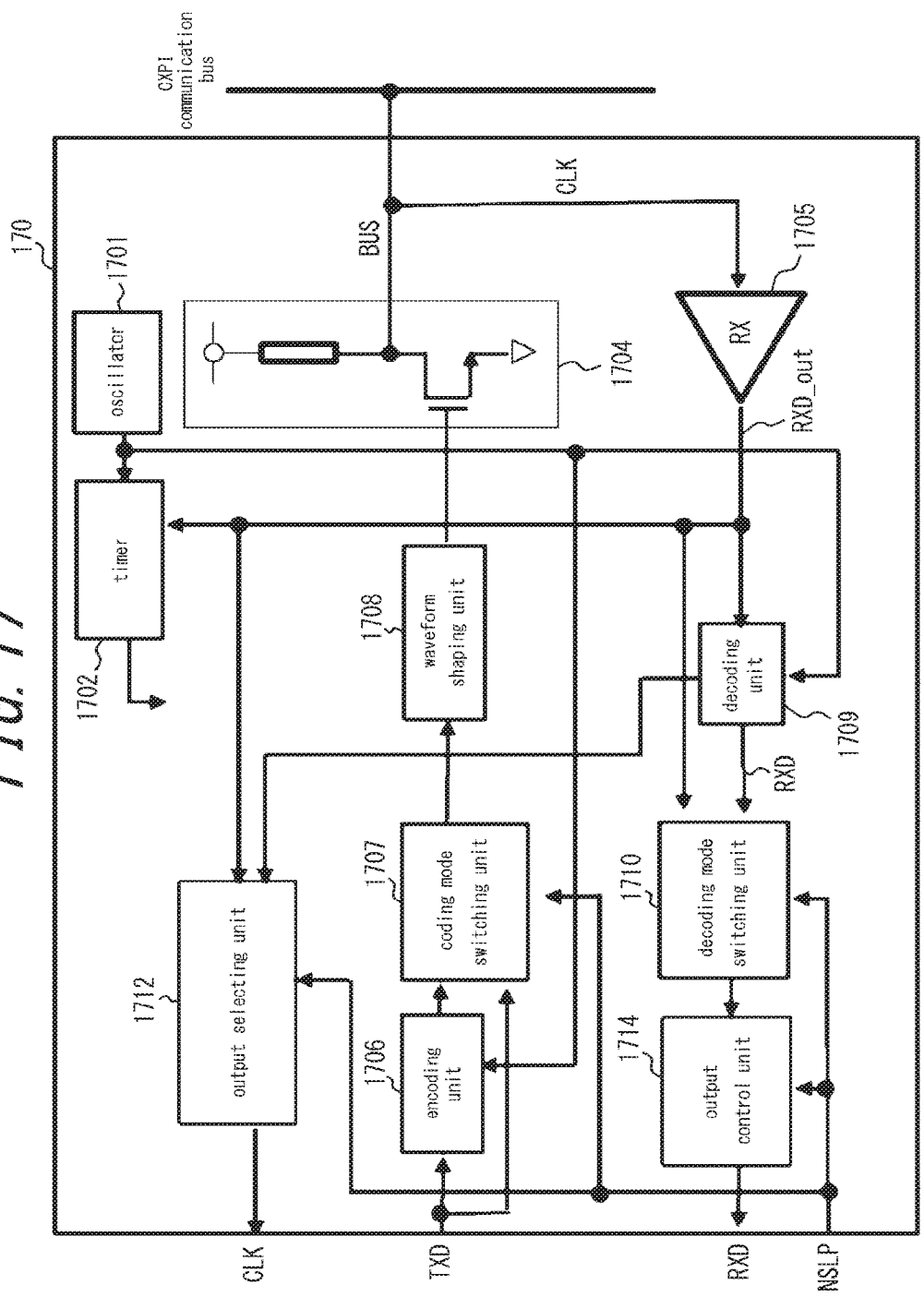
FIG. 17 is a diagram illustrating a configuration of a transceiver of a slave node of the fifth embodiment.
Figure 18:
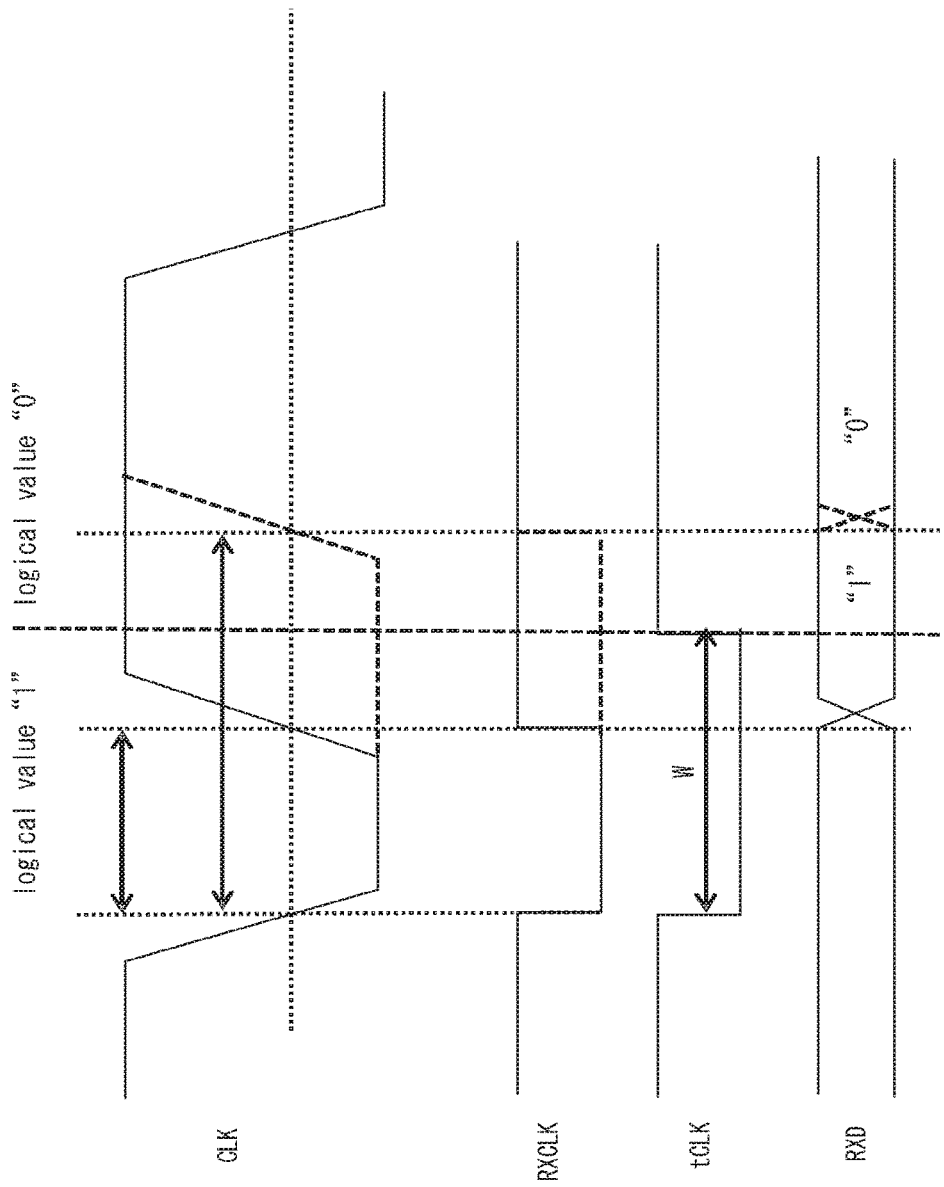
FIG. 18 is a diagram illustrating signals of a transceiver.

Referring to FIGS. 17 and 18, a configuration and operations of the present embodiment will be described. FIG. 17 illustrates the configuration of a transceiver of a slave node of the present embodiment. FIG. 18 illustrates signals exchanged among the units in the configuration of FIG. 17.

The transceiver 170 in FIG. 17 corresponds to the transceiver 104 in the configuration of the master node and a slave node illustrated in FIG. 1. In the transceiver 170, an oscillator 1701 supplies an internal clock to a timer 1702 and the timer 1702 sends control signals appropriately to other units. An interface 1704 controls delivery of signals to the bus.

Operations for receiving the data signal from the MPU and sending it towards the bus will be described. Data signal TXD sent from the MPU is encoded by a encoding unit 1706 and sent to a coding mode switching unit 1707.

The coding mode switching unit 1707, depending on whether the value of an enable signal NSLP sent from the MCU is "1" or "0", enables encoding (when "1") or disables encoding (when "0"). When the MPU selects the normal mode, coding is enabled by the enable signal NSLP. On the other hand, when the MPU selects the sleep mode, or in standby mode during the transition from the sleep mode to the normal mode, coding is disabled by the enable signal NSLP. The coding mode switching unit 1707, when the coding is enabled, sends the encoded data signal TXD to a waveform shaping unit 1708.

The waveform shaping unit 1708 sends the data signal TXD through the interface 1704 and to the bus, in accordance with the reference clock CLK sent from the master node.

Processing operations of signals received from the bus will be explained. The reference clock CLK received from the bus via the interface 1704 is amplified by a reception amplifier 1705, and sent as a received clock RXCLK to a decoding unit 1709, a decoding mode switching unit 1710 and an output selecting unit 1712. As illustrated in FIG. 18 the received clock RXCLK has a lower slew rate than the reference clock CLK, having a duty ratio corresponding to the logic value of the reference clock CLK.

Returning to FIG. 17, the decoding unit 1709 decodes the received clock RXCLK to generate decoded data RXD and a threshold clock tCLK. As illustrated in FIG. 18, the pulse width w of the threshold clock tCLK corresponds to the upper limit of the low level pulse width of the reference clock CLK. That is, the logical value of the reference clock CLK is "1" when its low level pulse width is less than w, or "0" when the low level pulse width is above w. Then, when the low level pulse width of the reference clock CLK is less than w, the threshold clock tCLK has a duty ratio corresponding to the low level of the width w, while, when the low level pulse width of the reference clock CLK is equal to or greater than w, the threshold clock tCLK has a duty ratio corresponding to the high level of the width w.

Returning to FIG. 17, the decoding unit 1709 outputs the threshold clock tCLK to the output selection unit 1712, and outputs the decoded data RXD to the decoding mode switching unit 1710.

The output selection unit 1712 switches the output to the MCU according to the value "1" or "0" of the enable signal NSLP. For example, when the MPU is at the normal mode, the enable signal NSLP has the value "1". In response thereto, the output selection unit 1712 selects a threshold clock tCLK, and outputs it to the MCU as an output clock oCLK. In this case, the threshold clock tCLK has a duty ratio corresponding to the logic value of the reference clock. On the other hand, when the MPU is at the sleep or standby mode, the enable signal NSLP has the value of "0". In response thereto, the output selecting unit 1712 selects the received clock RXCLK and outputs it to the MCU as the output clock oCLK. The output clock oCLK is, for example, input to an interrupt terminal of the MPU side.

The decoding mode switching unit 1710, as well as the coding mode switching unit 1707, depending on whether the value of the enable signal NSLP is "1" or "0", enables decoding (when "1"), or disables decoding (when "0"). That is, at the normal mode, the decoding is enabled, while at the sleep mode or standby mode, decoding is disabled. When decoding is enabled, the decoding mode switching unit 1710 outputs the decoded data signal RXD in accordance with the reference clock CLK. The data signal RXD is sent to an output control unit 1714.

The output control unit 1714, depending on whether the value of the enable signal NSLP is "1" or "0", enables transmission of the data signal RXD to the MPU (when "1"), or disables transmission of the data signal RXD to the MPU (when "0"). For example, when the MPU is at the normal mode, the enable signal NSLP has the value "1". In response thereto, the output control unit 1714 sends the data signal RXD to the MPU. On the other hand, when the MPU is at the sleep or standby mode, the enable signal NSLP has the value "0". In response thereto, the output control unit 1714 stops the transmission of the data signal RXD.

Figure 19:
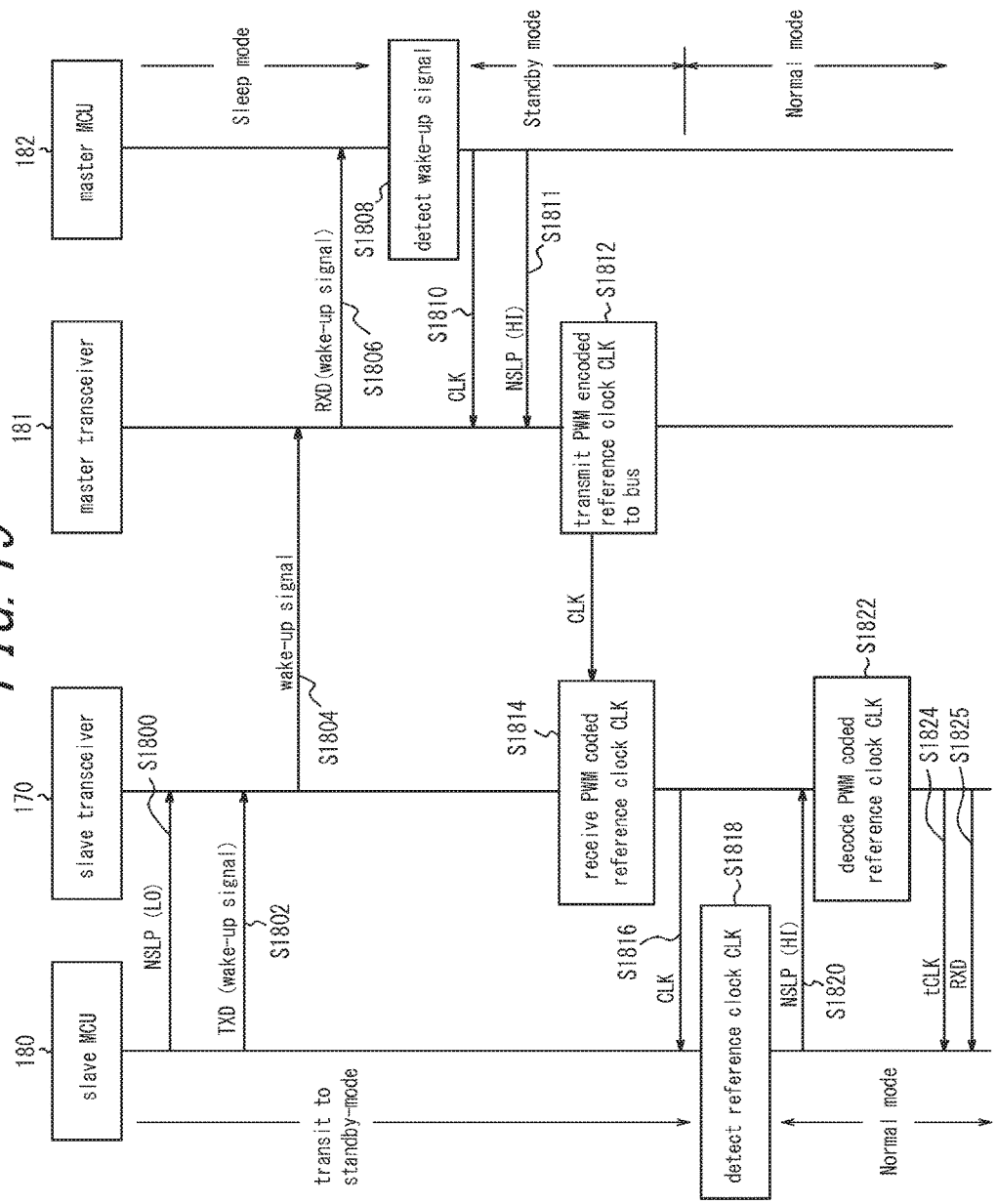
FIG. 19 is a diagram illustrating a communication sequence of a slave node and a master node.

FIG. 19 illustrates a communication sequence of the slave node and the master node in this embodiment. FIG. 19 depicts the communication sequence of the slave node MCU 180, the transceiver 170, the master node MCU 182 and the transceiver 181. Here, for the sake of convenience, these nodes are respectively referred to as a slave MCU 180, a slave transceiver 170, a master MCU 182 and a master transceiver 181. The slave transceiver 170 and the master transceiver 181 are connected via a bus (not illustrated). In this embodiment, the slave MCU 180 corresponds to a "control unit".

The slave MCU 180 sends the enable signal NSLP of the low level (logic "0") to the slave transceiver 170 (S1800), to shift the slave transceiver 170 to the sleep mode. Then, when a wake-up factor occurs, the slave MCU 180 sends a wake-up signal to the slave transceiver 180 (S1802). Slave transceiver 170 transmits the wake-up signal without being PWM coded to the master transceiver 181 (S1804).

The master transceiver 181 sends the received wake-up signal to the master MCU 182 (S1806). The master MCU 182 detects the wake-up signal (S1808). In response thereto, transiting from the sleep mode to the standby mode, the master MCU 182 generates the reference clock CLK and sends it to the master transceiver 181 (S1810). The master MCU 182 sends the enable signal NSLP of the high level (logical value "1") to the master transceiver 181 (S1811). In response thereto, the master transceiver 181 transits to the normal mode, and transmits the PWM encoded reference clock CLK to the bus (S1812).

The slave transceiver 170 receives the PWM coded reference clock CLK (S1814). If not having transited to the normal mode at this point, that is, still at the standby mode, the slave transceiver 170 sends the undecoded reception clock CLK to slave MCU 180 (S1816), and stops transmission of the decoded data signal RXD.

The slave MCU 180 detects the reference clock CLK (S1818), and, in order to transit to the normal mode, sends the enable signal NSLP of the high level (logic "1") to the slave transceiver 170 (S1820).

Then, the slave transceiver 170 transits to the normal mode, and decodes the PWM coded reference clock CLK that has been received (S1822). Then, the slave transceiver 170 sends the decoded threshold clock tCLK to the slave MCU 180 (S1824), and sends the decoded data signal RXD to the slave MCU 180 (S1825).

According to the above-described embodiment, since the MCU of the slave node measures a clock of the interrupt pin at the standby mode, the reference clock CLK from the master node may be detected. By transiting to the normal mode in response to this, the slave node can transit without malfunction to the normal operation using the decoded reference clock.

Sixth Embodiment

There may be a case that communication using asynchronous clocks is carried out where operation clocks are different between circuits. In such a communication using asynchronous clocks, metastability may be in concern, such that data remains in the intermediate potential at the timing of the set-up and hold. In case that two-stage flip-flop is provided to the receiving circuit as a counter measure for the metastability, two clocks are always spent on the receiving side, which causes a delay. Also, in the case of operation where the data transfer is temporarily suspended when the asynchronous clocks between the circuits no longer maintain a predetermined phase difference, a delay due to the temporal suspension may cause an inconvenience.

The sixth embodiment relates to a circuit for controlling transmitting/receiving circuits which operate with asynchronous clocks, such that the phase difference between the clocks is maintained. To remove metastability, one of the aims is to provide a clock control circuit and a data reception circuit that can realize high-speed data transmission and reception.

Figure 20:
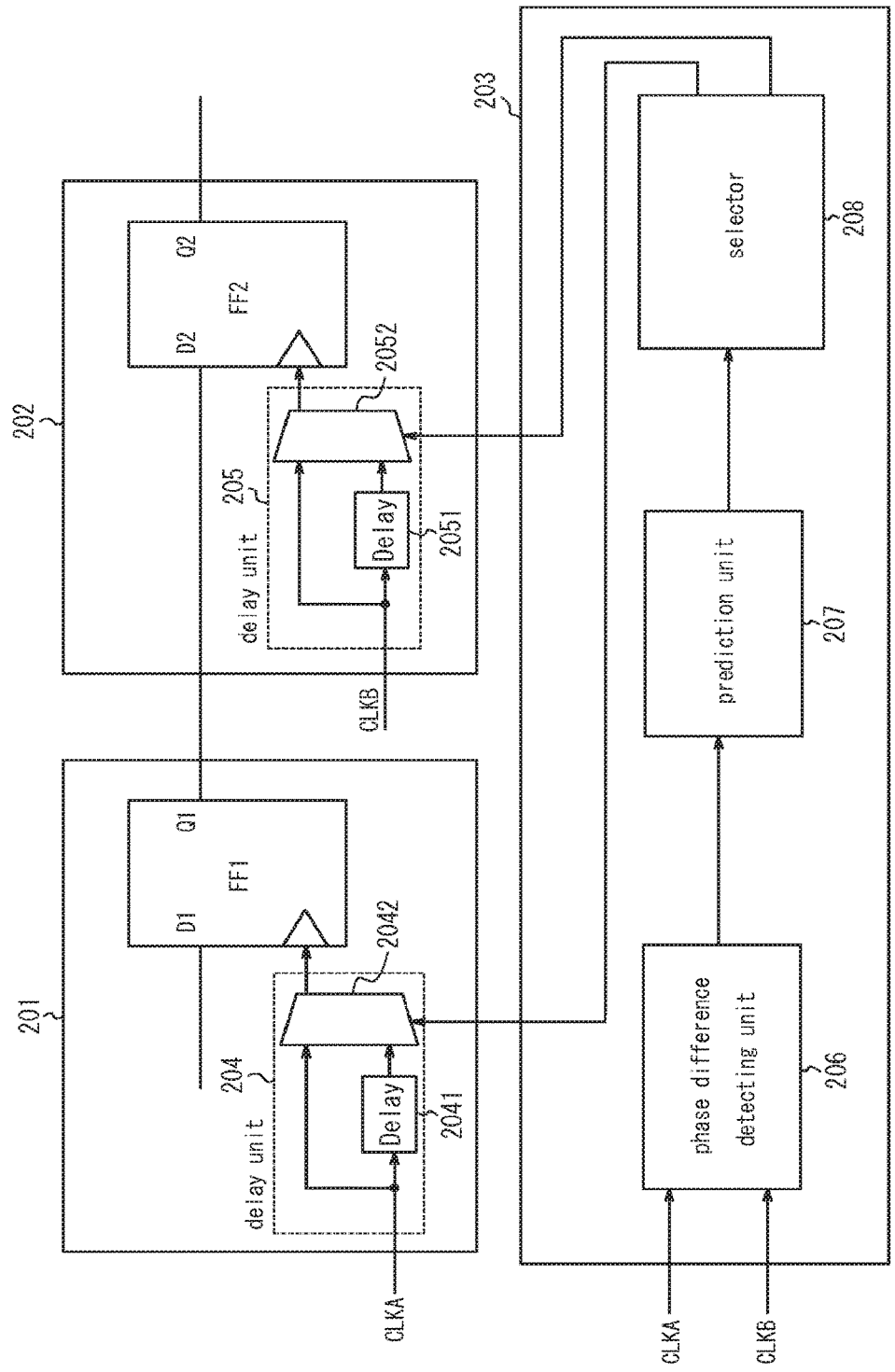
FIG. 20 is a diagram illustrating a configuration of a transceiver of the slave node of the sixth embodiment.

FIG. 20 illustrates a configuration of the circuit of the present embodiment. In the embodiments presented herein, the terms "part", "device" and "system" not only mean physical mechanisms, but also include realization of functions that the "part", "device" and "system" have, by software. They are including a control unit 203 for controlling data communication with an asynchronous clocks between a transmission-side circuits 201 and a reception-side circuits 202, and delay units 204 and 205 respectively provided to the transmission-side circuits 201 and the reception-side circuits 202.

The transmission-side circuits 201 is supplied with a clock CLKA from a clock generator (not illustrated). The clock CLKA is delayed by the delay circuit 2041 of the delay unit 204. The selector 2042 of the delay unit 204 selectively sends the clock CLKA or the delayed clock CLKA' to a flip-flop circuit FF1, according to a control signal from the control unit 203.

The reception-side circuits 202 is supplied with a clock CLKB from a clock generator (not illustrated). The clock CLKB is delayed by the delay circuit 2051 of the delay unit 205. The selector 2051 of the delay unit 205 selectively sends the clock CLKB or the delayed clock CLKB' to a flip-flop circuit FF2, according to a control signal from the controller 203.

Figure 21:
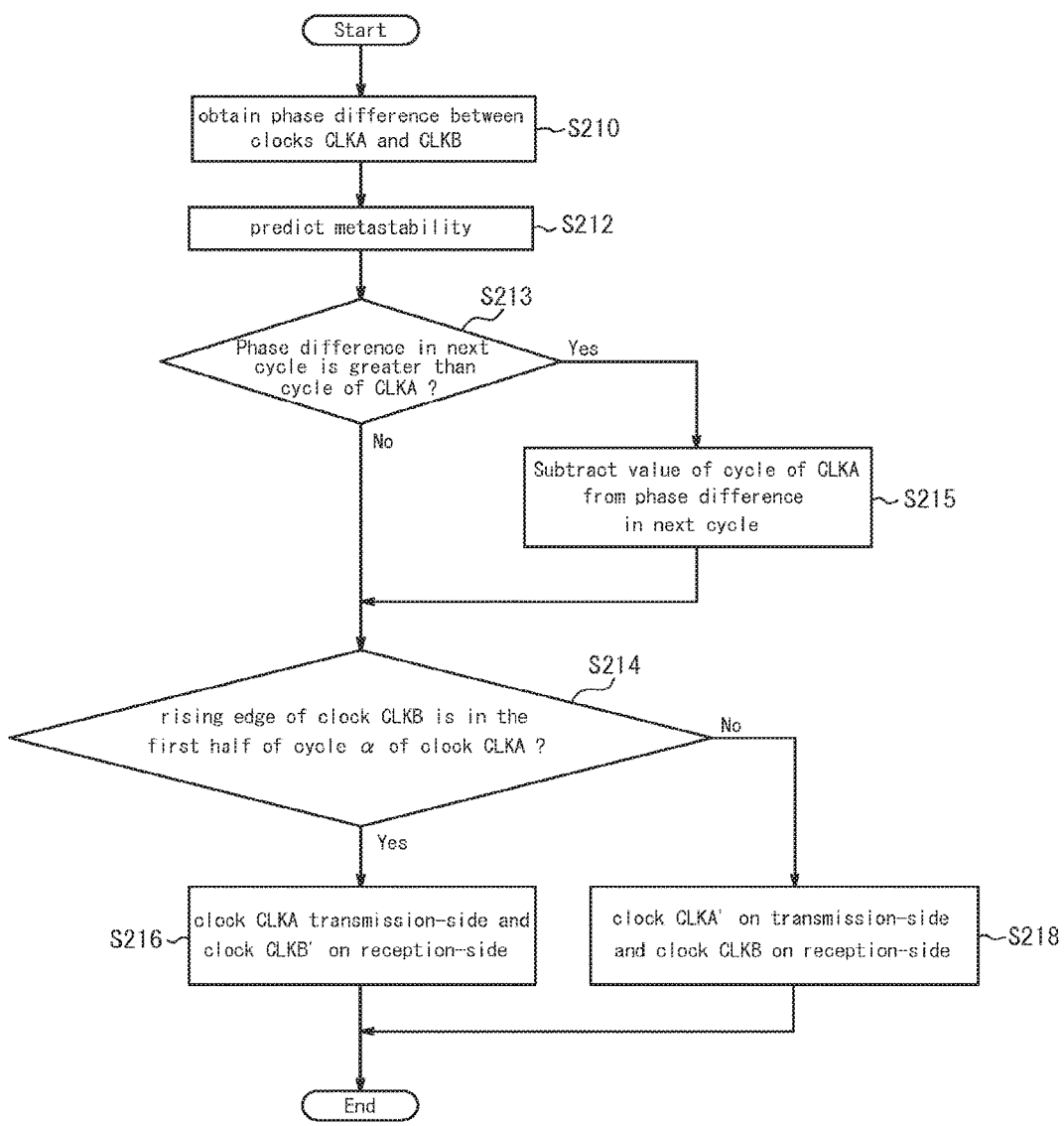
FIG. 21 is a flowchart illustrating operations of a circuit.
Figure 22:
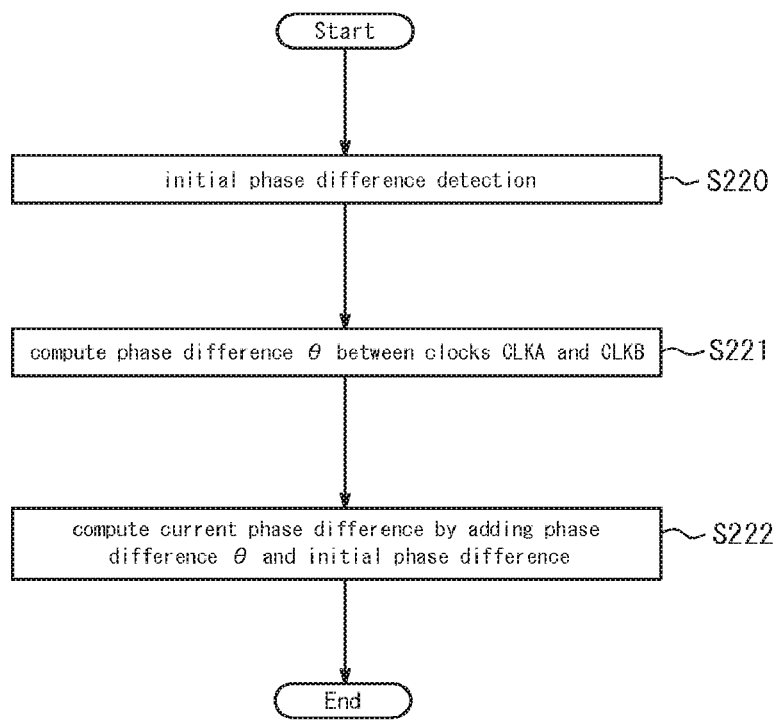
FIG. 22 is a flowchart illustrating operations of a circuit.
Figure 23:
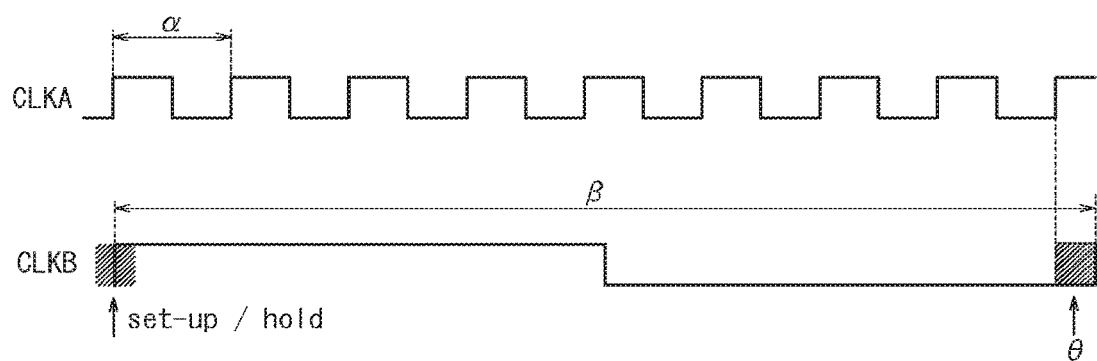
FIG. 23 is a diagram illustrating an example of a clock.
Figure 24:
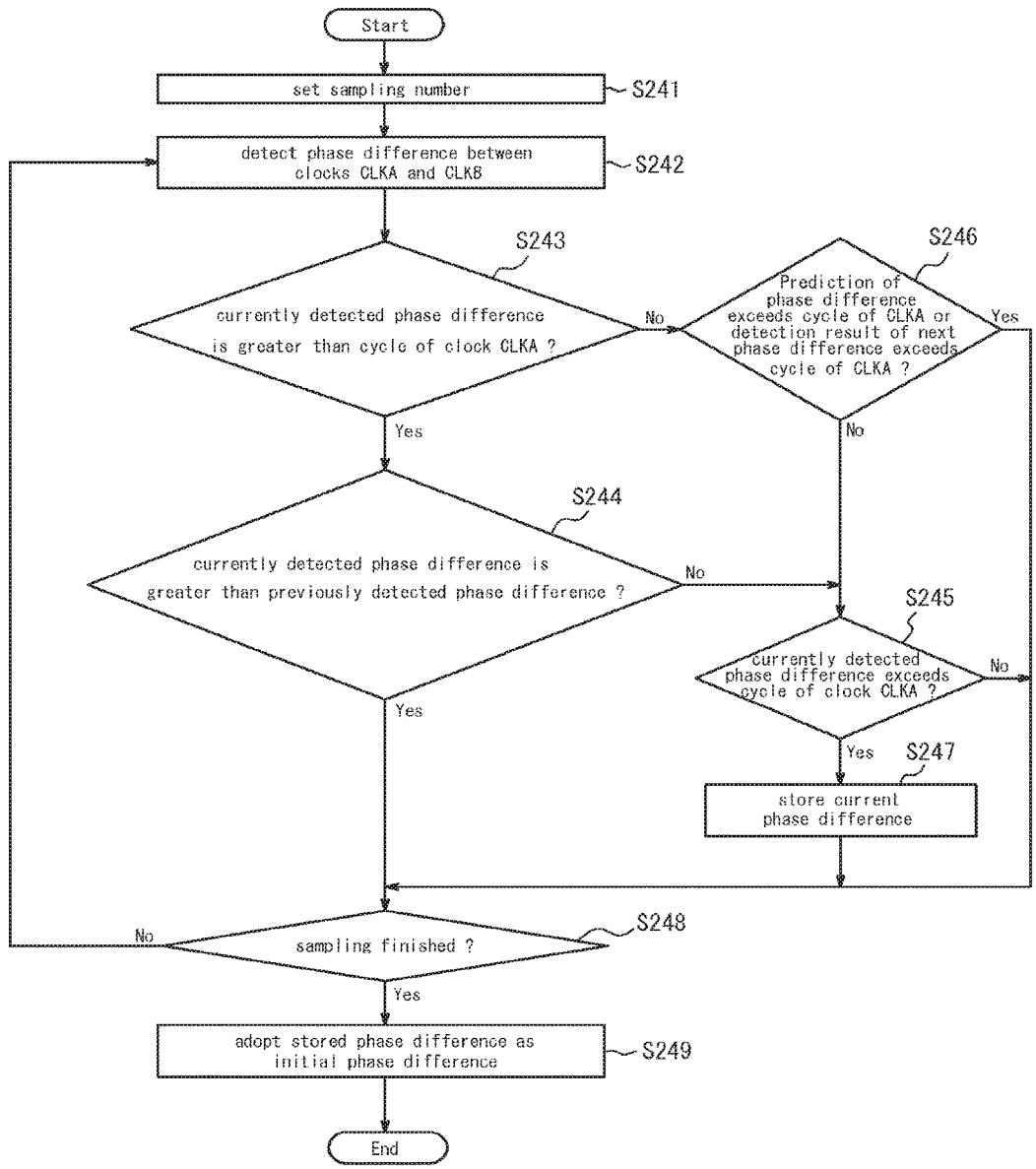
FIG. 24 is a flowchart illustrating operations of a circuit.

The control unit 203 has a phase difference detecting unit 206, a prediction unit 207 and a selector 208. The control unit 203 may be configured by using a DSP, an ASIC or a microcomputer. Here, with reference to FIGS. 21-25, operations of the controller 203 will be described. FIGS. 21, 22 and 24 are flowcharts illustrating the operations of the circuits of this embodiment. FIG. 23 illustrates an example of the clocks CLKA and CLKB.

The phase difference detecting unit 206 is input with the clocks CLKA and CLKB, and obtains the phase difference between the clocks CLKA and CLKB (FIG. 21, S210). Details of this step S210 is illustrated in FIG. 22.

The phase difference detecting unit 206 first performs the initial phase difference detection (FIG. 22, S220). Further details of this step S220 is illustrated in FIG. 24.

The phase difference detecting unit 206 sets a sampling number (S241), and detects the phase difference between the clocks CLKA and CLKB by a known method (S242). Then, when the currently detected phase difference is greater than the cycle of the clock CLKA (S243 Yes), and the currently detected phase difference is greater than the previously detected phase difference (S244 Yes), the phase difference detecting unit 206 checks whether sampling is finished (S248). If the sampling is not finished, the process returns to the step S242.

When the currently detected phase difference is equal to or less than the cycle of the clock CLKA (S243 No), and the prediction of the phase difference exceeds the cycle of CLKA or the detection result of the next phase difference exceeds the cycle of CLKA (S246 No), or, when the currently detected phase difference is less than the previously detected phase difference (S244 No), and currently detected phase difference is greater than stored phase different (S245 Yes), the phase difference detecting unit 206 stores the current phase difference (S247). On the other hand, when the currently detected phase difference is equal to or less than the cycle of the clock CLKA (S243 No), the initial phase difference is greater than the cycle of the clock CLKA (S246 Yes), and the currently detected phase difference is equal or less than stored phase difference (S245 No), the process proceeds to the step S248.

When the sampling is finished (S248 Yes), the phase difference detecting unit 206 adopts the stored phase difference as the initial phase difference (S249), and ends the process in FIG. 24

Returning to FIG. 22, the phase difference detecting unit 206 performs the step S221. That is, the phase difference detecting unit 206 detects, as illustrated in FIG. 23, a cycle α of the clock CLKA and a cycle β of the clock CLKB (wherein β>α), and computes a phase difference θ between the clocks CLKA and CLKB wherein remainder of θ=β/α. The computed phase difference θ is sent to the prediction unit 207. Then, the phase difference detecting unit 206 computes the current phase difference (S222), by obtaining a sum of the phase difference θ obtained at the step S221 and the initial phase difference obtained at step the S220.

Returning to FIG. 21, the prediction unit 207 predicts a cycle when metastability occurs (S212) based on relation between the clocks CLKA and CLKB, and the phase difference θ. To be more concrete, in the case that the current phase difference is greater than the cycle of the clock CLKA, the prediction unit 207 predicts the difference between the current phase difference and the cycle of the clock CLK as the cycle when metastability occurs. Then, if the phase difference θ in the next cycle is greater than cycle of the clock CLKA (S213 Yes), the prediction unit 207 subtracts the value of the cycle of the clock CLKA from the phase difference θ in the next cycle (S215).

Then the selecting unit 208 determines, based on the predicted metastability occurrence cycle, whether the clock CLKB rises in the first half or in the second half of the cycle α of the clock CLKA (S214). To be more concrete, the selection unit 208 determines the first half, when the following formula holds, with regard to the phase difference γ.

$$\gamma+(\beta-\alpha x)<\beta/2$$

Here, x is the number of cycles of the clock CLKA a included in one cycle β of the clock CLKB. On the other hand, the selection unit 208 determines the second half when the following formula holds.

$$\gamma+(\beta-\alpha x)>=\beta/2$$

When the rising edge of the clock CLKB is in the first half of the cycle α of the clock CLKA (S214 Yes), the selecting unit 208 sends control signals to each delay units 204 and 205, so that the clock CLKA is selected on the transmission-side circuits 201 while the clock CLKB' is selected on the reception-side circuits (S216). In this case, the delay unit 205 generates the clock CLKB' by adding sum of the setup and hold times to the clock CLKB. Conversely, when the rising edge of the clock CLKB is in the second half of the cycle α of the clock CLKA (S214 No), the selecting unit 208 sends control signals to each delay units 204 and 205, so that the clock CLKA' is selected on the transmission-side circuits 201 while the clock CLKB is selected on the reception-side circuits (S218). In this case, the delay unit 204 generates the clock CLKA' by adding sum of the setup and hold times to the clock CLKA.

Figure 25:
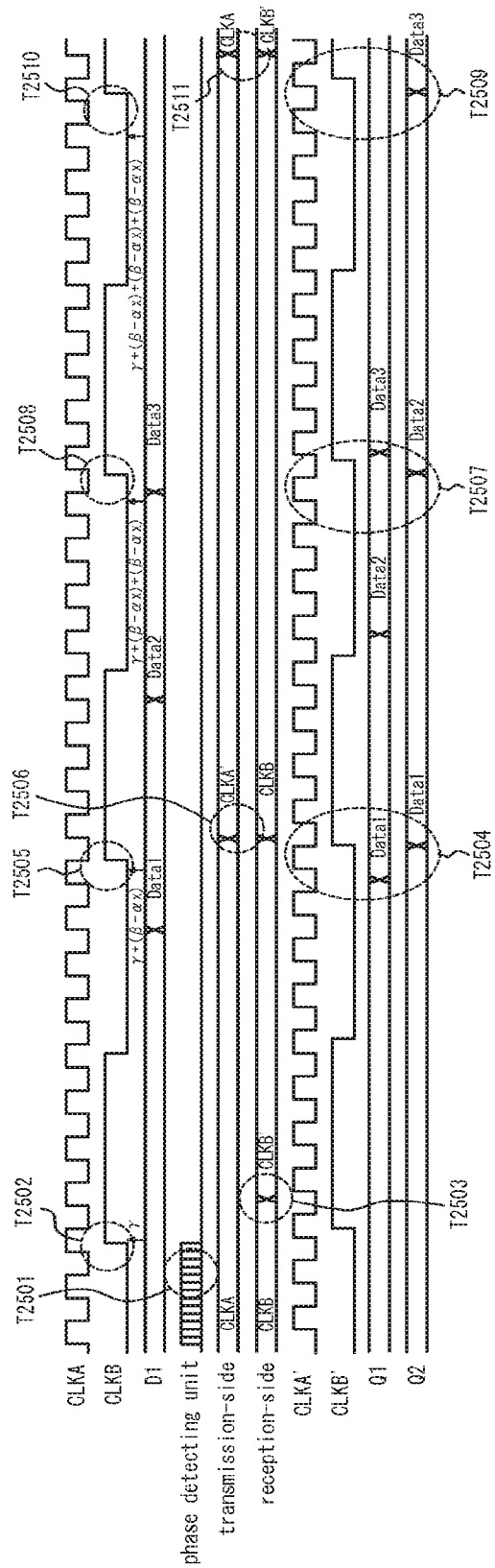
FIG. 25 is a timing chart illustrating signals.

FIG. 25 is a timing chart of the signals. FIG. 25 depicts the clocks CLKA, CLKA', CLKB and CLKB', the input D1 and Q1 of the flip-flop circuits FF1, and the output Q2 of the flip-flop circuit FF2. The horizontal axis represents the time. In FIG. 25, the timings T2501-T2511 of the above-mentioned procedure are mapped.

At the timing T2501, the step S220 is executed. Then, at the timing T2502, the steps S221, S222 and S214-S214 are executed. In this part of FIG. 25, the rising edge of the clock CLKB is in the first half of the cycle α of the clock CLKA. Then, at the timing T2503, the steps S212 and S216 are executed, and the clock CLKB' is selected. Then, at the timing T2504, data transmitted with the clock CLKA is received with the clock CLKB'.

At the timing T2505, the step S222 is executed. The current phase difference θ is determined as γ+(β−αx). Here, the current phase difference θ does not exceed the cycle α of the clock CLKA. Then, the steps S214-S214 are executed. In this part of FIG. 25, the rising edge of the clock CLKB is in the second half of the period of the clock CLKA a. Then, at the timing T2506, the steps S212 and S216 are executed, and the clock CLKA' is selected. Then, at the timing T2507, data transmitted with the clock CLKA' is received with the clock CLKB.

At the timing T2508, the step S222 is executed. The current phase difference θ is determined as γ+(β−αx)+(β−αx). Here, the current phase difference θ does not exceed the period a of the clock CLKA. Then, the steps S214-S214 are executed. In this part of FIG. 25, the rising edge of the clock CLKB is in the second half of the cycle α of the clock CLKA. Then, the steps S212 and S216 are performed, and the clock CLKA' is selected. Then, at the timing T2509, data transmitted with the clock CLKA' is received with the clock CLKB.

At the timing T2510, the step S222 is executed. The current phase difference θ is determined as γ+(β−αx)+(β−αx)+(β−αx). Here, since the current phase difference θ exceeds the cycle α of the clock CLKA, the difference between the current phase difference (θ−α), in other words, γ is computed. Then, γ is determined to be in the first half of the cycle α of the clock CLKA, and the steps S212 and S216 are executed, thus clock CLKB' being selected. Then, at the timing T2511, data transmitted by the clock CLKA is received by the clock CLKB'.

According to the present embodiment, by properly maintaining the phase difference between the clocks of the transmission-side circuits and the reception-side circuits, metastability may be avoided. Therefore, data communication may be performed without inconvenience, and this embodiment may preferably applied to frequent access to a register, a high-speed read/write a circuits, and the like. Calculating flow chart of the initial phase difference of FIG. 24 can be applied to adjust the error of the phase difference.

Seventh Embodiment

For an on-vehicle LAN, in order to suppress interference by radiation of harmonics with other devices, edges of pulse signals are rounded by waveform shaping, and a square wave signal rather close to a sine wave shape is used. For waveform shaping, DA (Digital to Analog) converter and the like is used. In each ECU, the shaped signal is stored in an output buffer, and sent to the bus after appropriately amplified by a multi-stage non-inverting amplifier circuit and the like.

Figure 26:
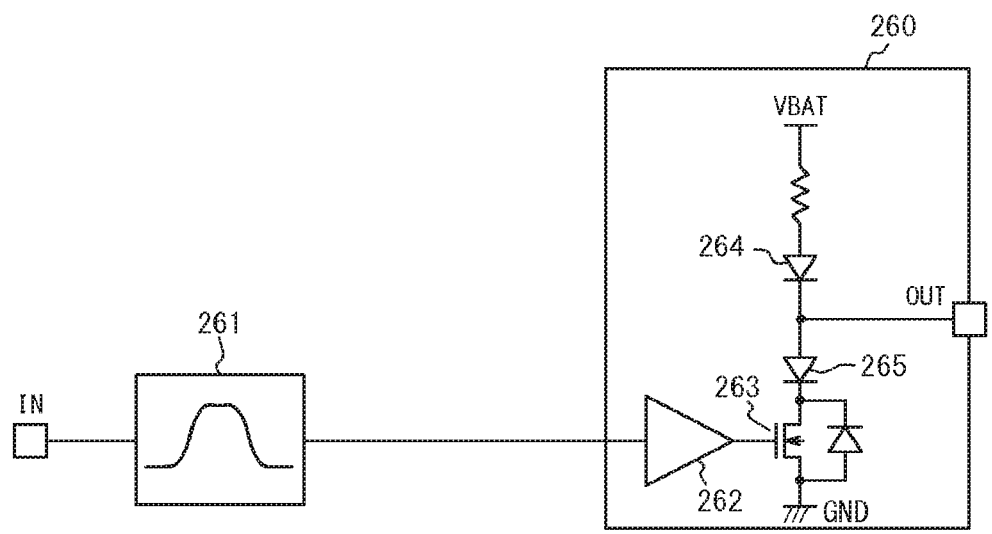
FIG. 26 is a diagram illustrating a schematic configuration of a transceiver of an on-vehicle electronic device.

Furthermore, with an on-vehicle LAN, there may be a case that wiring to a power supply or to the ground is disconnected due to vibration during traveling, and the voltage to be supplied to the bus fluctuates. In order to prevent electric current flowing back from the bus due to voltage fluctuation, a configuration illustrated in FIG. 26 may be adopted. FIG. 26 is a schematic diagram illustrating a transceiver of an ECU. An output signal sent from the MPU is input into an input terminal IN, and goes through waveform shaping by a waveform shaping unit 261. Then the signal is multi-stage amplified by an amplifier 262 of an output stage 260, and supplied to a transistor switch 263. Bus diodes 264 and 265 are provided to the power supply (VBAT) side and the ground (GND) side of the output terminal OUT for preventing reverse current. Thereby, the bus voltage is maintained higher than the power supply potential even when disconnected with the ground, and lower than the ground potential even when disconnected with the power supply.

Figure 27:
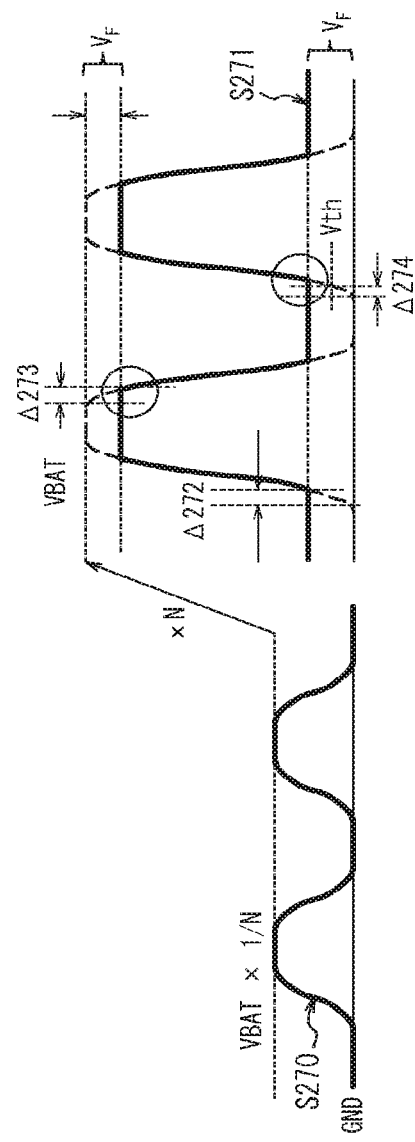
FIG. 27 is a diagram illustrating an example of a signal of an on-vehicle electronic device.

FIG. 27 illustrates an example of signals in the configuration of FIG. 26. Transmission signal S271, obtained by amplifying a transmission signal S270 by N times by the amplifier 262 is a square-wave signal close to a sine wave, having the high level nearly equal to potential of the power supply VBAT, and the low level nearly equal to the ground GND potential. However, when the transmission signal S271 after the amplification is sent out from the output terminal OUT, the waveform is deformed such that the high level is lowered from the power supply potential by the forward voltage drop VF of diodes 264 and 265, and the low level is raised from the ground potential by VF. Then, delays Δ272 and Δ273 may occur respectively on the originally intended rising and falling edges.

Moreover, when the transmission signal S271 is at the high level, in order to suppress the leakage current of the transistor switch 263, the transistor switch 263 is turned off by the signal S270 falling to the low level. Then, when the transmission signal S270 again rises to the high level, delay Δ274 may occur in turning on the transistor switch 263 by the time to reach the threshold voltage Vth of the gate of the transistor switch 263.

For on-vehicle LANs, LIN or CXPI communication protocol is used, and in the CXPI communication, signals passed on the bus are designated to be PWM-encoded, and thus higher-frequency pulse signals are used than the LIN. In such a case, the aforementioned delays may deteriorate the quality of data communication signals. Alternatively, the signal slew rate may be lowered so that the signal edge sharply rises, but doing so may enhance higher harmonics.

In view of the above, the present embodiment relates to a transceiver of the ECU for suppressing the harmonics and for preventing a signal delay.

Figure 28:
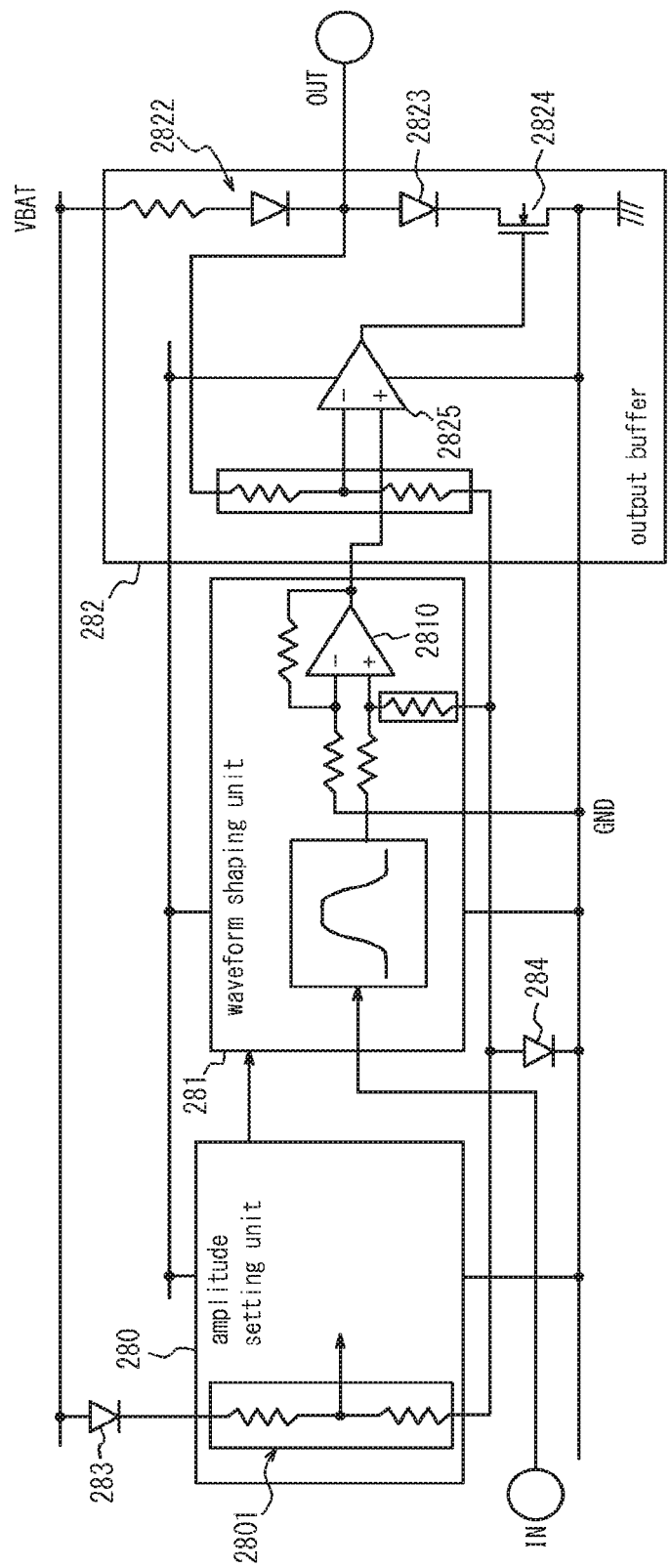
FIG. 28 is a diagram illustrating a configuration of a transceiver in the seventh embodiment.

FIG. 28 illustrates a configuration of a transceiver of the present embodiment. The transceiver of FIG. 28 has a configuration for dealing with delays Δ272 and Δ273 illustrated in FIG. 27. The transceiver is provided in an ECU constituting each node in the CXPI communication system, and has a configuration for PWM encoding and transmitting the bus transmission signal sent from the MPU (not illustrated).

This transceiver has an amplitude setting unit 280, a waveform shaping unit 281, and an output buffer 282. Each unit is connected to a power supply potential VBAT and the ground potential GND. Transmission signal input from the input terminal IN is amplified by an op-amp (operational amplifier) 2810 of the waveform shaping unit 281, and sent to the output buffer 282. In the output buffer 282, a transistor switch 2824 is tuned ON-OFF controlled by the transmission signal amplified by an op-amp 2825, and, in sync with this, the transmission signal is sent out from the output terminal OUT to the bus. The power supply side and the ground side of the output terminal OUT are respectively provided with diodes 2822 and 2823 for preventing reverse flow in case of potential voltage fluctuation due to the disconnection.

The amplitude setting unit 280 and the waveform shaping unit 281 are connected to the power supply potential VBAT and the ground potential GND, respectively through diodes 283 and 284. The diodes 283 and 284 have the same specification as the diodes 2822 and 2823 of the output buffer 282. Thereby, the amplitude setting unit 280 and the waveform shaping unit 281 have current flows at the same current density as the output buffer 282, and operate in the voltage between the potential lower than the supply voltage VBAT by forward voltage drop VF of the diodes 283, 284, 2822 and 2823, and the potential higher than ground potential GND by VF. At this time, a feedback terminal of the op-amp 2810 of the waveform shaping unit 281 and a feedback terminal of the op-amp 2825 of the output buffer 282 are also connected to the potential higher than the ground potential GND by VF.

The amplitude setting unit 280 sends to the waveform shaping unit 281 a voltage detected by the voltage detecting unit 2801. The waveform shaping unit 281 generates a transmission signal, with an amplitude of the sensed voltage, and amplified it by the op-amp 2810. The amplified transmission signal is sent to the output buffer 282, and a corresponding signal is sent to the bus.

Figure 29:
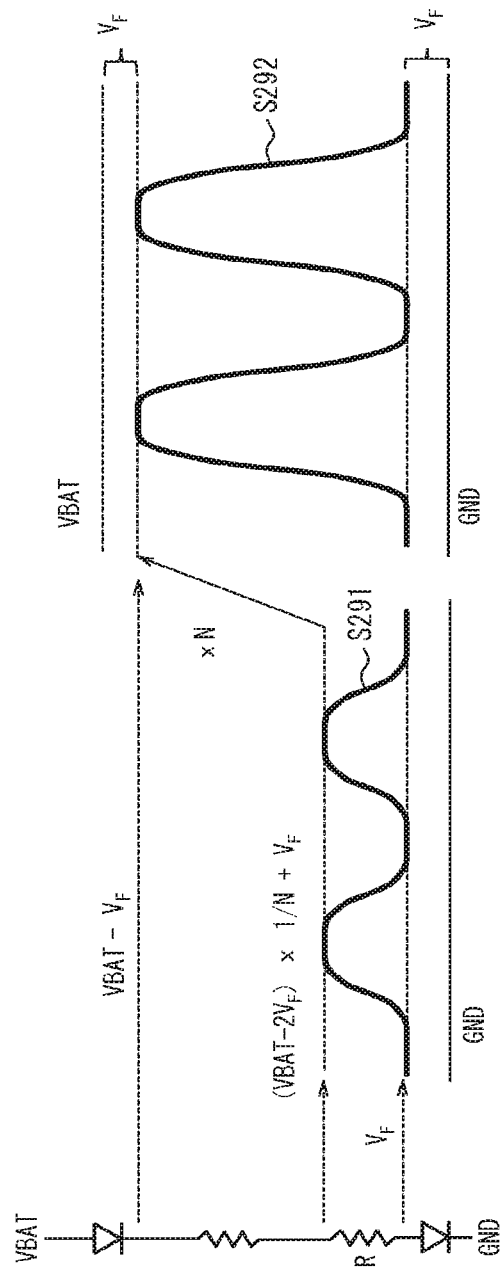
FIG. 29 is a diagram illustrating signals of a transceiver.

Here, FIG. 29 illustrates examples of a signal generated by the signal waveform shaping unit 281 and a signal sent from the output buffer 282. A transmission signal S291 generated by the waveform generator 281 has an amplitude, between the potential (VBAT-VF) and the potential (GND+VF), with the high level potential of ((VBAT-2VF)×1/N+VF) and the low level potential of (GND+VF). This signal is N-times amplified to obtain a transmission signal S292 which has the high level potential of (VBAT-VF) and the low level potential of (GND+VF). Thus, by performing a waveform shaping of a transmission signal by subtracting a voltage of the forward voltage drop of the diodes, the transmission signal may be generated and sent out, which is not affected by the forward voltage drop of the diodes at the time of transmission. Accordingly, the signal sent from the output buffer 282 can be prevented from being delayed with respect to the signal generated by the signal waveform shaping unit 281.

Figure 30:
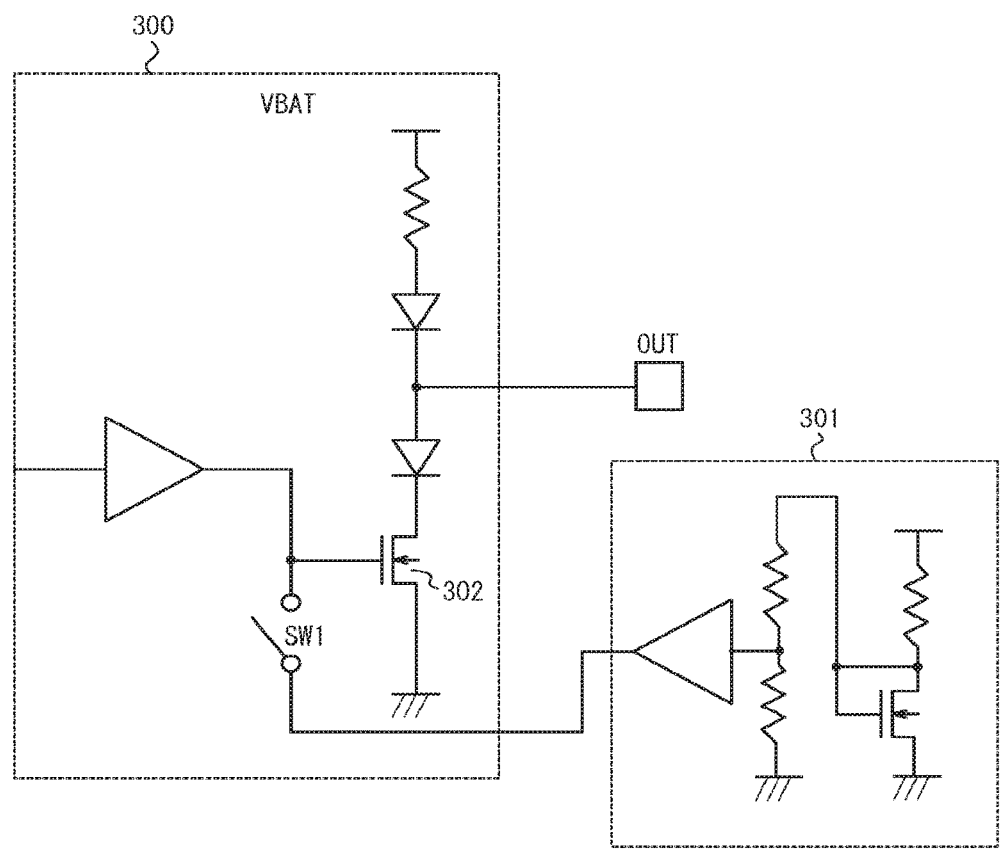
FIG. 30 is a diagram illustrating another aspect of the seventh embodiment.

FIG. 30 illustrates another aspect of this embodiment. This aspect has a configuration for dealing with the delay Δ274 illustrated in FIG. 27. In FIG. 30, a pull-down voltage generator 301 is connected to the output buffer 300. A pull-down voltage generator 301 supplies to the gate through a switch SW1 a voltage which is lower than the threshold voltage Vth of a transistor switch 302 of the output buffer 300 and higher than the ground voltage. Thereby, when the edge of the transmission signal rises, the voltage of the transmission signal can reach the threshold voltage Vth in a shorter time than when the edge rises from the ground level. Thus, the delay Δ274 of the transmission signal to be sent to the bus can be reduced, as illustrated in FIG. 27.

Figure 31:
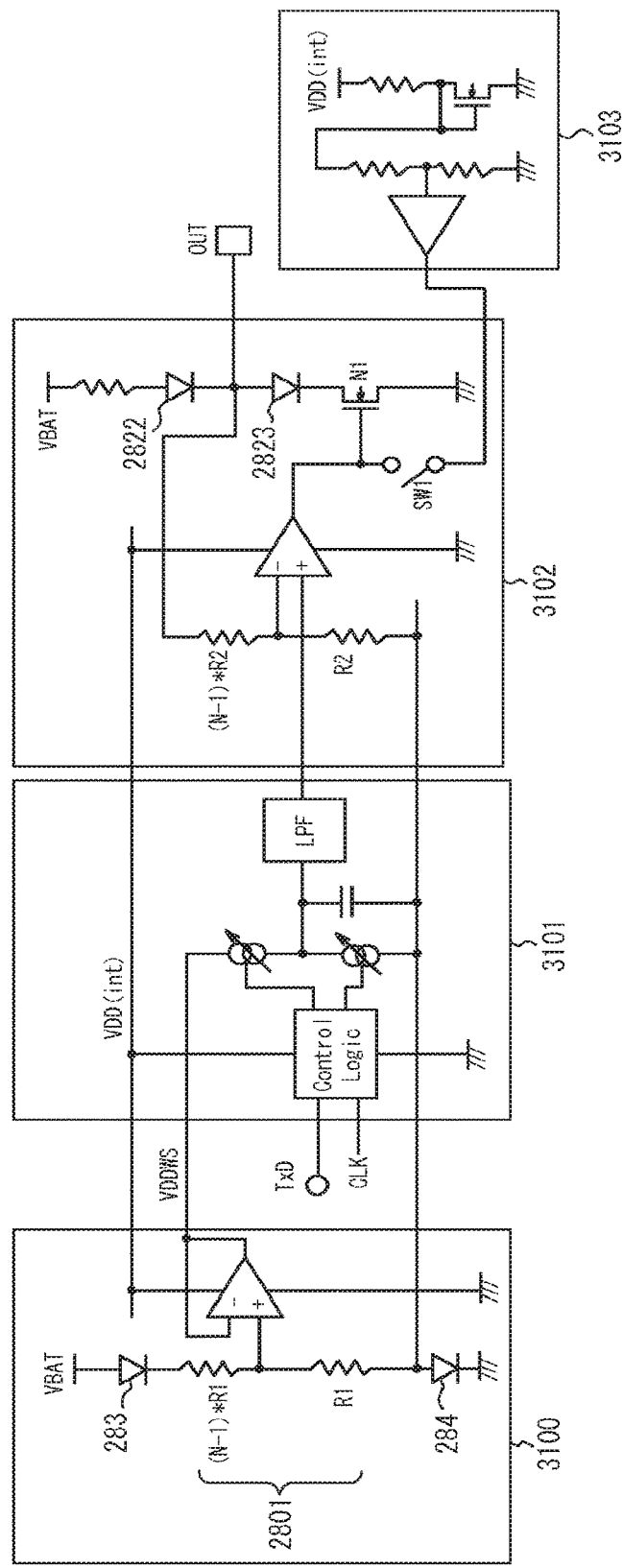
FIG. 31 is a diagram illustrating an example of the seventh embodiment.

FIG. 31 illustrates a preferable example. The transceiver of this example has a amplitude setting unit 3100, a waveform shaping unit 3101, an output buffer 3102, and a pull-down voltage generator 3103.

Figure 32:
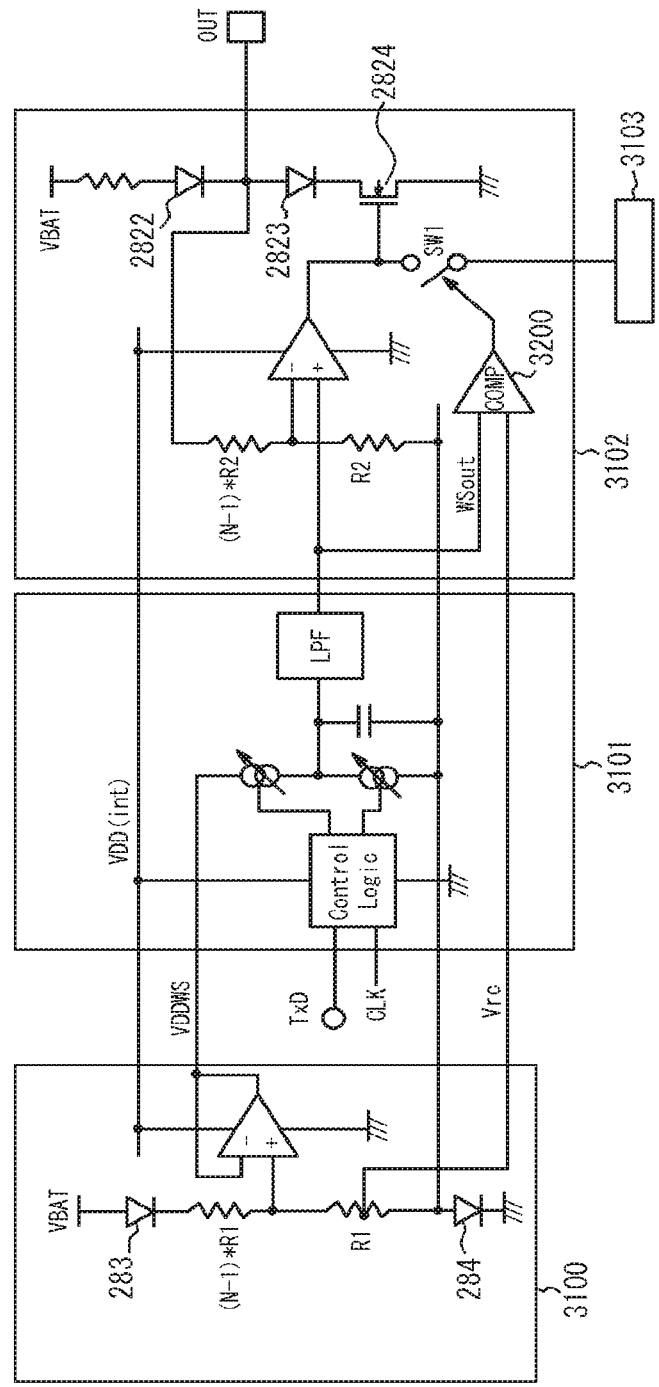
FIG. 32 is a diagram illustrating a modified example.
Figure 33:
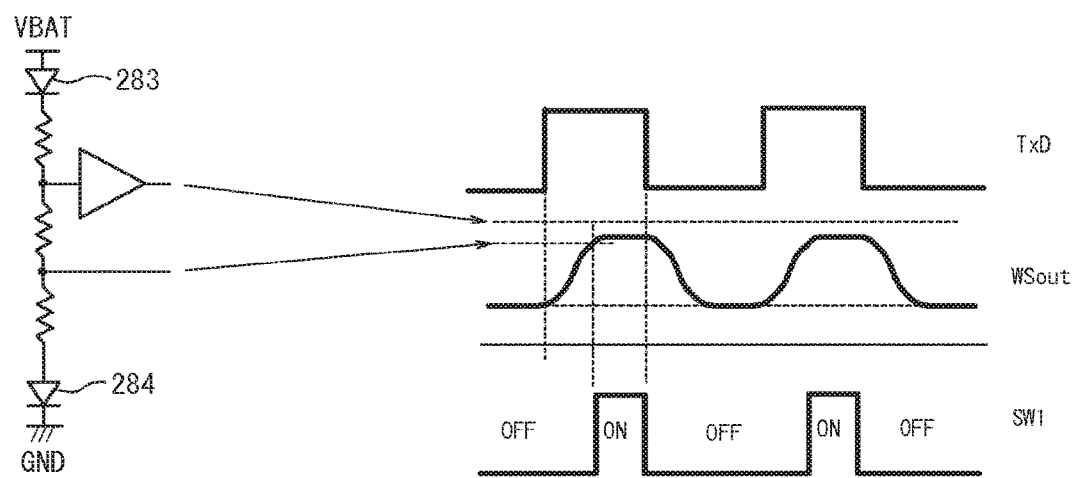
FIG. 33 is a diagram illustrating signals of a modified example.

FIG. 32 illustrates a modified example of the example illustrated in FIG. 31. In FIG. 32, elements that overlap with FIG. 31 are denoted by the same reference numerals as in FIG. 31. In the example of FIG. 32, a comparator 3200 turns the switch SW1 when the output signal WS out of the waveform shaping unit 3101 reaches a predetermined reference voltage Vrc. Since the high level of output signal from the waveform shaping unit 3101 is voltage VDOWS lowered from the power supply voltage VDD by the forward voltage drop of the diode 283, even lower voltage, for example, the lower voltage by the voltage drop of a resistance R1 is used as a reference voltage Vrc for turning on the switch SW1. Thereby, as illustrated in FIG. 33, the transmission signal WSout rises with the rise of the transmission signal TXD inputted to the waveform shaping unit 3101, and the switch SW1 is turned on before the transmission signal WSout reaches the high level. In this way, the gate voltage for turning on the transistor switch 2824 is allowed to elevate in advance to near the threshold voltage Vth by a pull-down voltage generator 3103, and thus the transistor switch 2824 can be turned on with the rise of the transmission signal WSout.

Figure 34:
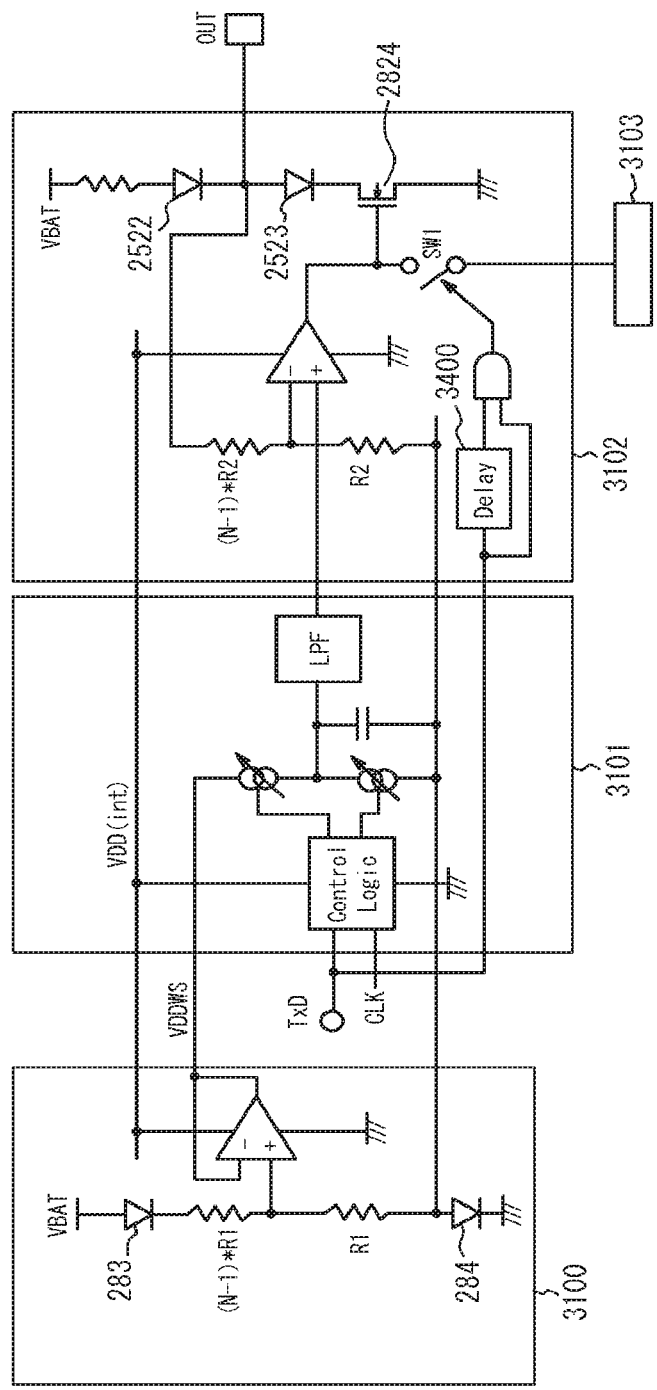
FIG. 34 is a diagram illustrating another modified example.
Figure 35:
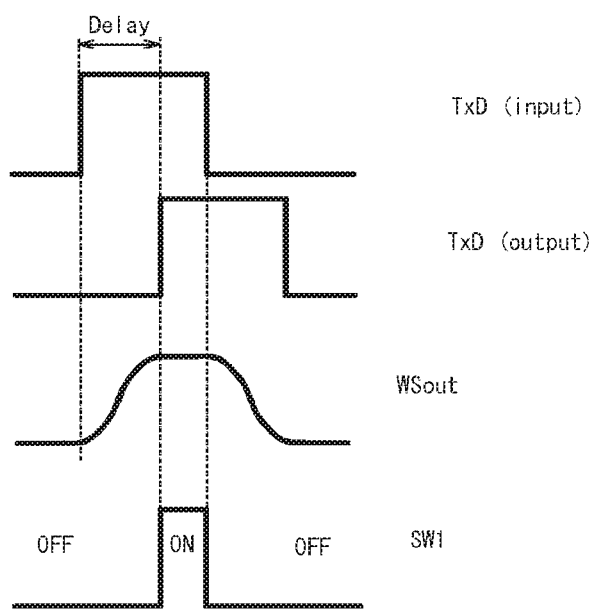
FIG. 35 is a diagram illustrating signals of yet another modified example.

FIG. 34 illustrates yet another modified example of the example illustrated in FIG. 31. In FIG. 34, elements that overlap with FIG. 31 are denoted by the same reference numerals as in FIG. 31. In the example of FIG. 34, a delay circuit 3400 delays the input signal TXD to the waveform shaping unit 3101, and the switch SW1 is turned on when the delayed input signal TXD reaches the high level. Thereby, as illustrated in FIG. 35, the transmission signal WSout rises with the rise of the transmission signal TXD inputted to the waveform shaping unit 3101, and the switch SW1 can be turned on nearly at the same time as the transmission signal WSout reaches the high level. In this way, the gate voltage for turning on the transistor switch 2824 rises from the vicinity of the threshold voltage Vth, and therefore the transistor switch 2824 can be turned on without significant delay from the rising edge of the transmission signal WSout.

Figure 36:
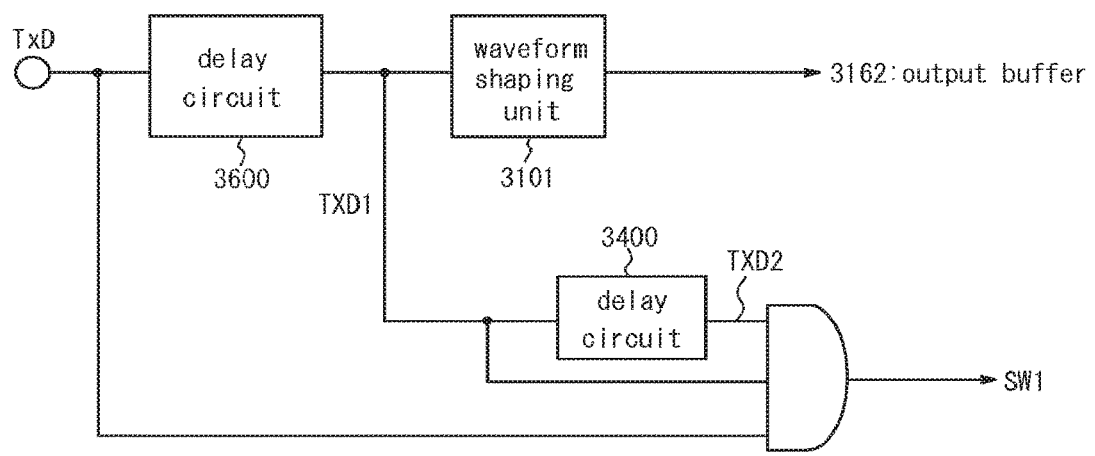
FIG. 36 is a diagram illustrating yet another modified example.
Figure 37:
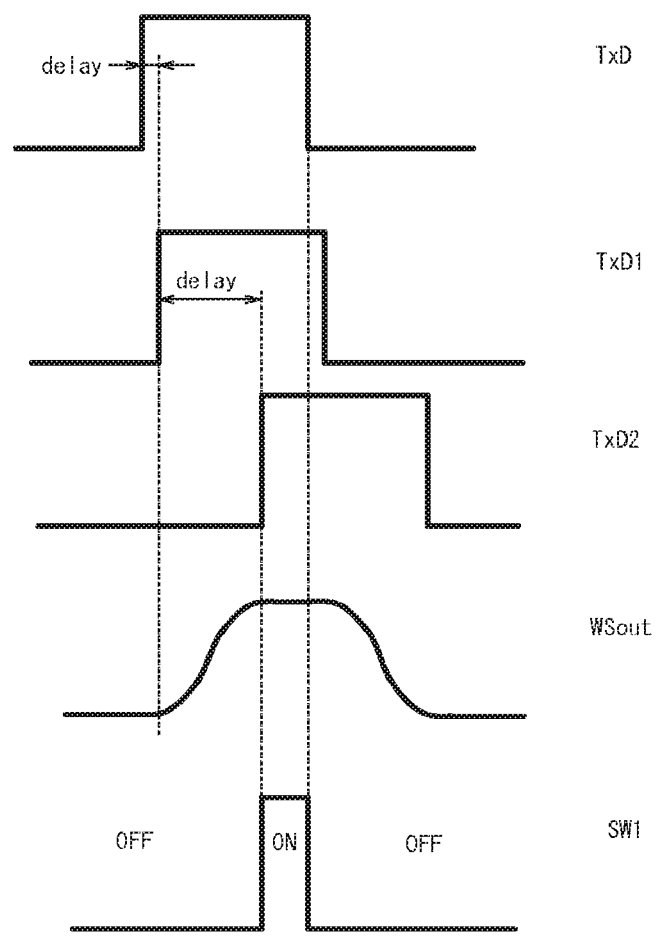
FIG. 37 is a diagram illustrating signals of yet another modified example.

FIG. 36 illustrates a modified example of the configuration illustrated in FIG. 34. This configuration has, in addition to the delay circuit 3400, a delay circuit 3600 before the waveform shaping unit 3101, such that the logical product of the transmission signal TXD, a transmission signal TXD1 further delayed by the delay circuit 3600, and a transmission signal TXD2 obtained by yet further delaying the transmission signal TXD1 by the delay circuit 3400 turns on the switch SW1 of the output buffer 3102. Thereby, as illustrated in FIG. 37, the transmission signal WSout rises with the rise of the transmission signal TXD, and the switch SW1 is turned on nearly at the same time as the transmission signal WSout reaches the high level. The configuration of FIG. 36 has a shorter time period when the switch SW1 is kept ON than the example of FIG. 34. By doing so, while obtaining an equivalent advantageous effect to FIG. 34, the power can be saved.

According to this embodiment, with the on-vehicle LAN of the LIN and CXPI, even in the case of using a transmission signal of a low slew rate in order to suppress harmonics, the delay of the transmitted signal can be prevented.

Although the present invention has been described based on embodiments and the accompanying drawings, it is to be noted that various changes and modifications will be apparent to those skilled in the art based on the present disclosure. Therefore, such changes and modifications are to be understood as included within the scope of the present invention. For example, the functions and the like included in the various members and steps may be reordered in any logically consistent way. Furthermore, components or steps may be combined into one or divided.

The above described embodiments are summarized as additions listed below.

(Addition 1) An on-vehicle electronic device comprising:
a generating unit configured to generate a first clock for data communication with another on-vehicle electronic device through a CXPI communication network; and
an adjusting unit configured to adjust a duty width of the first clock.

(Addition 2) The on-vehicle electronic device according to Addition 1, wherein
the adjusting unit generates a second clock having a frequency higher than that of the first clock, and adjusts the duty width of the first clock at a ratio of a number of clocks of the second clock corresponding to a cycle of the first clock.

(Addition 3) The on-vehicle electronic device according to Addition 1 or 2, wherein
the adjusting unit adjusts the duty width of the first clock before encoding data to be transmitted.

(Addition 4) The on-vehicle electronic device according to any one of Additions 1-3, wherein
the adjusting unit adjusts the duty width of the first clock when transmitting encoded data to be transmitted.

(Addition 5) The on-vehicle electronic device according to any one of Additions 1-4, which performs as a master node of the CXPI communication network.

(Addition 6) An on-vehicle electronic device comprising:
a generating unit configured to generate a first clock for data communication with another on-vehicle electronic device through a CXPI communication network; and an adjusting unit configured to perform spectrum spreading to the first clock.

(Addition 7) The on-vehicle electronic device according to Addition 6, wherein the adjusting unit obtains a modulation frequency of the spectrum spreading based on a predetermined modulation ratio and a frequency of the first clock.

(Addition 8) The on-vehicle electronic device according to Addition 6 or 7, wherein the modulation frequency is greater than 200 Hz and smaller than a product of a predetermined target frequency and the predetermined modulation ratio.

(Addition 9) The on-vehicle electronic device according to any one of Additions 6-8, further comprising a transceiver configured to round a rising edge and a falling edge of the first clock subject to the spectrum spreading and to transmit the first clock to the network.

(Addition 10) An on-vehicle electronic device comprising:

a delay unit configured to generate a first clock by delaying an internal clock;

a shaping unit configured to generate a second clock by increasing a slew rate of the internal clock;

a switch configured to output a third clock based on the first and second clocks, the third clock having a rising edge of the first clock and a falling edge of the second clock; and an interface configured to cause the third clock to become a low level when a reference clock used for data communication with another on-vehicle electronic device through a CXPI communication network becomes a low level.

(Addition 11) The on-vehicle electronic device according to Addition 10, wherein the third clock becomes a low level while the reference clock is a low level.

(Addition 12) An on-vehicle electronic device comprising:

a detecting unit configured to detect a cycle of a clock and a phase difference between the clock and a data signal generated separately from the clock;

a computing unit configured to obtain a data capturing timing shifted from a edge of the clock based on the cycle and the phase difference; and a synchronization unit configured to capture a value of the data signal at the timing of the data capturing timing and generate a data signal to be transmitted to another on-vehicle electronic device through a CXPI communication network.

(Addition 13) The on-vehicle electronic device according to Addition 12, wherein the computing unit adjusts a shift width of the data capturing timing from the edge of the clock wherein the data capturing timing is for capturing a value of the data signal after a starting bit, based on whether or not the value of the starting bit is captured at the timing of the edge of the clock.

(Addition 14) The on-vehicle electronic device according to Addition 12 or 13, which generates the clock when performing as a master node of the CXPI communication network, or receives the clock, when performing as a slave node of the CXPI communication network, from a master node of the CXPI communication network.

(Addition 15) The on-vehicle electronic device according to any one of Additions 12-14, wherein the detecting adopts an average of a plurality of detections as the phase difference.

(Addition 16) The on-vehicle electronic device according to any one of Additions 12-15, wherein the detecting unit, when detecting the cycle, excludes a clock shorter than a predetermined lower limit and a clock longer than a predetermined upper limit.

(Addition 17) An on-vehicle electronic device comprising:

a transceiver configured to operate in a first mode for receiving a reference clock which is encoded through a CXPI communication network from a master node, for decoding the reference clock, and for outputting the reference clock as a first output clock, or in a second mode for outputting as a second output clock the reference clock without decoding;

a control unit configured to send to the transceiver a signal to cause the transceiver to transit from the first mode to the second mode, and to obtain the first output clock from the transceiver, on receiving the second output clock from the transceiver, by sending to the transceiver a signal to cause the transceiver to transit from the second mode to the first mode.

(Addition 18) The on-vehicle electronic device according to Addition 17, wherein the transceiver includes a decoding unit configured to decode the reference clock, and an output selecting unit configured to selectively output either of the first and second clocks to the control unit according to the first and second modes.

(Addition 19) The on-vehicle electronic device according to Addition 17 or 18, wherein the transceiver includes a decoding unit configured to decode a data signal which is encoded and received from another on-vehicle electronic device through the network, and an output controlling unit configured to output to the control unit the data signal being decoded when operating at the first mode or without decoding when operating at the second mode.

(Addition 20) The on-vehicle electronic device according to any one of Additions 17-19, wherein the transceiver, upon receiving the signal from the control unit, sends to the master node a signal to cause the master node to send the reference clock and to thereby obtain the reference clock.

(Addition 21) A circuit comprising:

a detecting unit configured to detect a phase difference between a first clock and a second clock having a frequency which is slower than that of the first clock;

a selecting unit configured to select, based on the phase difference and cycles of the first and the second clocks, a first pattern when an edge of the second clock corresponds to the first half of the cycle of the first clock, and a second pattern when the edge of the second clock corresponds to the second half of the cycle of the first clock; and a delay unit configured to delay the second clock without delaying the first clock in the first pattern, the first clock without delaying the second clock in the second pattern, and to transmit the first clock to a first circuit, which transmits data in sync with the first clock, and the second clock to a second circuit, which receives the data in sync with the second clock.

(Addition 22) The circuit according to Addition 21, wherein the detecting unit detects the phase difference based on the cycles of the first and second clocks.

(Addition 23) The circuit according to Addition 22, wherein the detecting unit detects a first phase difference based on the cycles of the first and second clocks, and then detects a second phase difference based on the first phase difference and the cycles of the first and second clocks.

(Addition 24) The circuit according to any one of Additions 21-23, which is included together with the first and second circuits within an electronic device for controlling a vehicle.

(Addition 25) An on-vehicle electronic device comprising:

an output buffer configured to amplify a signal, which is input, to have an amplitude between a first potential lower than a power supply potential and a second potential above a ground potential, and output the signal to an on-vehicle network; and a shaping unit configured to shape a signal, which is input, to have an amplitude such that the signal has the amplitude between the first and second potentials when output from the output buffer.

(Addition 26) The on-vehicle electronic device according to Addition 25, wherein the output buffer has a transistor switch to be turned on/off to generate a signal to be transmitted to the on-vehicle network, the transistor switch being turned on when a signal output from the shaping unit reaches a high level, further comprising:

a voltage generator configured to supply the transistor switch with a threshold voltage thereof;

a switch configured to turn on/off a supply of the threshold voltage to the transistor switch from the voltage generator; and a circuit configured to turn on the switch before a signal sent from the shaping unit to the output buffer reach a high level.

What is claimed is:

1. A device comprising:
a transceiver configured to operate over a Clock Extension Peripheral Interface (CXPI) bus, wherein the transceiver comprises:
a detecting unit configured to detect a baud rate clock signal and a phase difference between the baud rate clock signal and an input data signal that was generated asynchronously from the baud rate clock signal;
a computing unit configured to compute a data capturing timing from an edge of the baud rate clock signal based the phase difference; and
a synchronization unit configured to capture a value of the input data signal at the data capturing timing and to output the captured value as an output data signal for transmission over the CXPI bus.

2. The device of claim 1, wherein the computing unit is configured to adjust the data capturing timing from the edge of the baud rate clock signal based on whether processing of an ending bit of the input data signal is completed.

3. The device of claim 1, wherein the device is configured to operate as a master node in a CXPI communication network.

4. The device of claim 3, further comprising a controller integrally coupled to the transceiver, wherein the controller is configured to generate the baud rate clock signal.

5. The device of claim 1, wherein the device is configured to operate as a slave node in a CXPI communication network.

6. The device of claim 5, wherein the device is configured to receive the baud rate clock signal from a master node of the CXPI communication network.

7. The device of claim 1, wherein the detecting unit is configured to detect the phase difference based on a predetermined lower limit and a predetermined upper limit of cycles of the baud rate clock signal.

8. A method of operating a transceiver over a Clock Extension Peripheral Interface (CXPI) bus, the method comprising:
detecting, by a detecting unit of the transceiver, a baud rate clock signal and a phase difference between the baud rate clock signal and an input data signal that was generated asynchronously from the baud rate clock signal;
computing, by a computing unit of the transceiver, a data capturing timing from an edge of the baud rate clock signal based the phase difference;
capturing, by a synchronization unit of the transceiver, a value of the input data signal at the data capturing timing; and
outputting, by the synchronization unit, the captured value as an output data signal for transmission over the CXPI bus.

9. The method of claim 8, further comprising adjusting the data capturing timing from the edge of the baud rate clock signal based on whether processing of an ending bit of the input data signal is completed.

10. The method of claim 8, wherein the transceiver is disposed in a master node device of a CXPI communication network.

11. The method of claim 10, further comprising generating the baud rate clock signal by a controller of the master node device.

12. The method of claim 8, wherein the transceiver is disposed in a slave node device of a CXPI communication network.

13. The method of claim 12, further comprising receiving the baud rate clock signal from a master node device of the CXPI communication network.

14. The method of claim 8, wherein detecting the phase difference comprises excluding cycles of the baud rate clock signal that are below a predetermined lower limit and above a predetermined upper limit.

15. An on-vehicle system comprising:
a Clock Extension Peripheral Interface (CXPI) bus;
a device coupled to the CXPI bus, the device comprising a transceiver configured to:
detect a baud rate clock signal and a phase difference between the baud rate clock signal and an input data signal that was generated asynchronously from the baud rate clock signal;
obtain compute a data capturing timing from an edge of the baud rate clock signal based the phase difference;
capture a value of the input data signal at the data capturing timing; and
transmit the captured value as an output data signal over the CXPI bus.

16. The system of claim 15, wherein the transceiver is further configured to adjust the data capturing timing from the edge of the baud rate clock signal based on whether processing of an ending bit of the input data signal is completed.

17. The system of claim 15, wherein the device is configured as a CXPI master node.

18. The system of claim 17, wherein the device comprises a controller integrally coupled to the transceiver, and wherein the controller is configured to generate the baud rate clock signal.

19. The system of claim 15, wherein the device is configured as a CXPI slave node.

20. The system of claim 19, wherein the device is configured to receive the baud rate clock signal from a CXPI master node over the CXPI bus.

* * * * *